(12) United States Patent
Kakinoki et al.

(10) Patent No.: US 6,213,790 B1
(45) Date of Patent: Apr. 10, 2001

(54) INFORMATION PROCESSING APPARATUS

(75) Inventors: Wataru Kakinoki, Yokohama; Hisakazu Iwami, Suwa, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/343,876

(22) Filed: Jun. 30, 1999

(30) Foreign Application Priority Data

| Jun. 30, 1998 | (JP) | 10-199559 |
| Jun. 30, 1998 | (JP) | 10-199560 |
| Jul. 8, 1998 | (JP) | 10-208607 |

(51) Int. Cl.$^7$ .................................................. H01R 4/66
(52) U.S. Cl. .................................................. 439/95
(58) Field of Search .............................. 439/95, 101, 108, 439/607–610, 564–566, 570, 91, 76.1, 946

(56) References Cited

U.S. PATENT DOCUMENTS

| 5,547,397 | * | 8/1996 | Hirai | 439/607 |
| 5,940,275 | * | 8/1999 | Laity | 439/946 |
| 5,964,595 | * | 10/1999 | Centofante | 439/76.1 |

FOREIGN PATENT DOCUMENTS

| 0697806 | 2/1996 | (EP) . |
| 0794698 | 9/1997 | (EP) . |

\* cited by examiner

*Primary Examiner*—Gary Paumen
*Assistant Examiner*—Phuongchi Nguyen
(74) *Attorney, Agent, or Firm*—Ostrolenk, Faber, Gerb & Soffen, LLP

(57) ABSTRACT

A PC card is mounted with the connector on the card side at the connector mounting receptacle thereof, and the ground electrode is provided at an upper side thereof. Further, the adhesive film on the upper panel side is provided at the interior opposite to the connector on the card side of the upper panel, and the adhesive film on the connector side is provided on the upper surface of the rectangular body of the connector on the card side. The connector on the card side is mounted to the connector mounting receptacle, and upon that the ground electrode and the upper panel are provided at the upper side, and the lower panel is provided at the lower side. By heat pressing with a hot press, the adhesive film on the upper panel side and the adhesive film on the connector side fix the rectangular body of the connector on the card side and the plane part of the ground electrode in a state enhancing intimate contact thereof.

13 Claims, 23 Drawing Sheets

INFORMATION PROCESSING APPARATUS

BACKGROUND OF THE INVENTION

1. Field of the Invention

The present invention relates to an information processing apparatus of a type that is attachable/detachable to an external computer system, such as a PC card, and more particularly to an information processing apparatus that complies with the Specification defined by the PCMCIA (Personal Computer Memory Card International Association)/JEIDA (Japan Electronic Industry Development Association). In more detail, the present invention relates to an information processing apparatus having an adhesive continuity hole on a ground electrode, for making the ground electrode to be fixed firmly by an adhesive as being sandwiched between a housing and a body.

2. Description of the Related Art

With a recent technological innovation, various kinds of personal computers (PC) have been developed and commercially sold. Conventionally, an expansion of a PC peripheral environment has been, in many cases, implemented by attaching a desirable "adapter card" to a "bus slot" that is provided in the PC. An example of the adapter card is a video adapter, a communication (LAN) adapter, and an SCSI (Small Computer System Interface) card, etc.

However, an attachment of the adapter card is not practical for a notebook type computer which can not provide many bus slots. As a result, in order to provide for expandability of the notebook type computer, a so called a "PC card" has been developed. The PC card is a kind of peripheral device with a size (54.0 mm×85.6 mm) of a credit card (bank card). The notebook computer can relatively easily expand the system configuration, by providing a card slot for inserting and electrically connecting the PC card.

The PC card is, because of the attachments/detachments at frequent intervals to/from the PC provided in a housing of a cartridge type. The guidelines regarding the mechanical and electrical specifications of the PC card are provided for by the PCMCIA (Personal Computer Memory Card International Association) and the JEIDA (Japan Electronic Industry Development Association), and are standardized in the industry.

In association with an increase of the bus width of personal computers, a 16-bit capable card and a 32-bit capable card have been developed as PC cards.

Usually, a driving voltage is 5.0 V for the 16-bit PC, but it is set to 3.3 V for the 32-bit PC card. By decreasing the driving voltage from 5.0 V to 3.3 V, it is necessary to provide a more secure ground connection between the PC (Personal Computer) and the PC card, in order to ensure a transmission, and a reception of a signal for the PC card and the computer body.

For example, as the 32-bit PC card, the one disclosed in the Japanese Unexamined Patent Publication No. 9-58163 and the like are known.

This PC card comprises a frame that one end thereof turns to be a connector mounting receptacle and that accommodates a circuit board inside thereof, two sheets of panels for covering both sides of said frame with lids, respectively, a connector provided at said connector mounting receptacle of said frame, for connecting said circuit board to a personal computer, and a ground electrode provided sandwiched between one of said two panels and said connector, for connecting a ground of said circuit board to a ground of a personal computer.

Also, in one of the panels, holes for accommodating a plurality of projections at a location of a connector mounting receptacle is provided, and said ground electrode comprises a plate part extended along a length direction of said connector, and projections formed at said plate and being projected respectively from each of holes in said panel. Further, since an adhesive film is provided at an interior of the panel, the panel and the ground electrode have been coupled by an adhesive, in a state that the projections of the ground electrode are projected from the holes of the panel.

Incidentally, according to the PC card in the above described prior art, although the ground electrode is adhered to one panel among the two panels, it is not fixed to the connector, and when the planeness of the plate part in the ground plate is not good, and when the planeness at a part corresponding to the connector mounting receptacle among the panels is not good, or when there are manufacturing errors in the individual parts of the ground electrode, the connector and the like, there is a problem that a central part of the ground electrode floats from the connector.

Further, when a torsional force or the like is added to the connector mounting receptacle of the casing, at a time of attaching/detaching the PC card to/from the card slot, there is also a problem that a central part of the ground electrode floats from the connector.

SUMMARY OF THE INVENTION

Accordingly, the present invention is made with regard to the problem in the prior art described above, and it is an object of the present invention to enhance the durability and reliability of a PC card, a by fixing a connector to a ground electrode while ensuring good electrical contact.

In order to solve the above described problem, the PC card according to the present invention comprises a frame body, one end thereof being a connector mounting receptacle, and for accommodating a circuit board at an inside thereof; two sheets of panels for covering both sides of the frame body in lids, respectively; a connector provided at a connector mounting receptacle of the frame body, and for connecting the circuit board to a personal computer; and a ground electrode provided sandwiched between one panel of the two sheets of panels and the connector, and for connecting a ground of the circuit board to a ground of the personal computer, wherein an adhesive film is provided between the connector and the ground electrode.

By configuring as describe above, the connector and the ground electrode can be fixed with an adhesive film in a state enhancing intimate contact, thereby preventing the ground electrode from floating.

According to the present invention, the ground electrode comprises: a plane part extending along a length direction of the connector; and a plurality of spring-like projections formed by making notches in the plate part, and for supplying a spring-property when inserting into a card slot on the personal computer side, wherein the adhesive film is provided between a flat surface between the spring-like projections adjacent each other among the plate part and the connector.

By configuring as described above, an adhesive film formed between the flat plane in-between the spring-like projections adjacent to each other among the plate part and the connector can fix the ground electrode and the connector, without restricting an operation of each of the spring-like projections.

According to the present invention, the adhesive film is provided on the connector side in advance, and has a configuration such that the ground electrode is coupled to the adhesive film.

By configuring as described above, the adhesive film can be easily provided by a screen printing.

Also, according to the present invention, in the ground electrode, a conduction path that guides the adhesive film provided in the one panel to the connector is provided.

By configuring as described above, the adhesive film provided in one of the panels is guided to the connector side through a conduction path of the ground electrode, and as including the ground electrode, one of the panels and the connector can be coupled in a state enhancing an intimate contact, thereby preventing the ground electrode from floating.

Further, according to the present invention, the ground electrode comprises: a plane part extending along a length direction of the connector; and a plurality of spring-like projections formed by making notches in the plate part, and for supplying a spring-property when inserting into a card slot on the personal computer side, wherein the conduction path is provided on a flat surface between the spring-like projections adjacent each other among the plate part.

By configuring as described above, an adhesive film formed between the flat plane in-between the spring-like projections adjacent to each other can fix one of the panels, the ground electrode and the connector through the conduction path, without restricting an operation of each of the spring-like projections.

According to the present invention, the ground electrode comprises: a plane part extending along a length direction of the connector; and a plurality of projections formed on the plate part, wherein the conduction path is provided on a flat surface between the projections adjacent each other among the plate part.

By configuring as described above, an adhesive film formed between the flat plane in-between the spring-like projections adjacent to each other can fix one of the panels, the ground electrode and the connector through the conduction path.

According to the present invention, in an adhesive film provided on the one panel, a projection part is included at a location corresponding to a conduction path of said ground electrode.

By configuring as described above, a tip of a projection part of the adhesive film can intruded to the connector side through the connection path of the ground electrode, and as including the ground electrode, the adhesive film can fix one of the panels and the connector in a state enhancing intimate contact.

According to the present invention, an adhesive film is provided at a location opposite to the one panel in the connector, and in the ground electrode, a conduction path that guides the adhesive film provided in the one panel to the one panel is provided.

By configuring as described above, the adhesive film provided in the connector is guided to one of the panel's side through the connection path of the ground electrode, and as including the ground electrode, can couple the connector with one of the panels in a state enhancing intimate contact, thereby preventing the ground electrode from floating.

According to the present invention, a bend that is bent toward the connector is provided at the tip of one of the panels.

By configuring as described above, the bend provided at the tip of one of the panels enhances the planeness of the tip, thereby enhancing the strength of the bend and thus can suppress a deformation of the tip. Then, the ground electrode sandwiched between one of the panels and the connector can be fixed firmly to the connector.

Other features of the present invention will be apparent from the following description.

DESCRIPTION OF THE PREFERRED EMBODIMENTS

Figure 1:
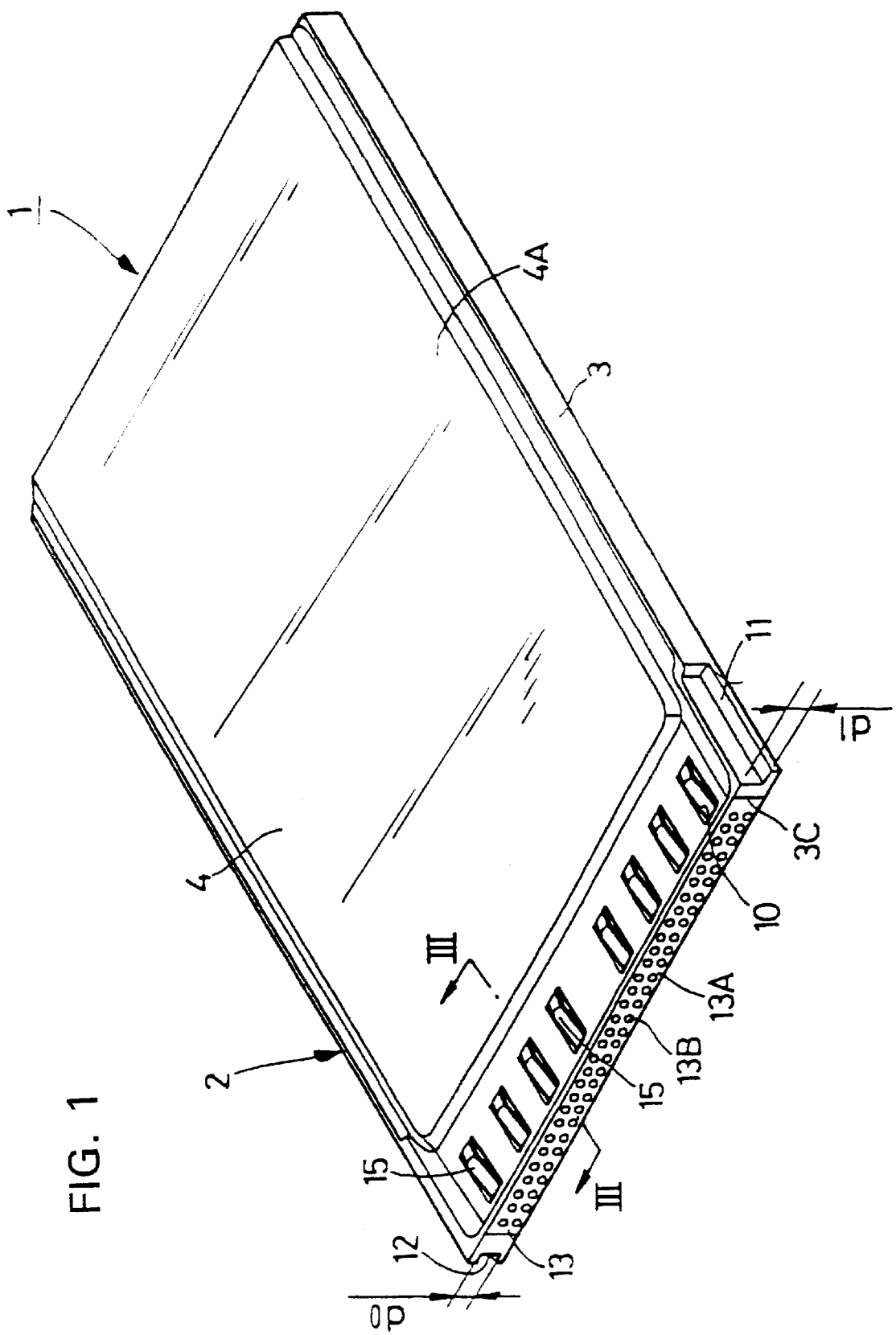
FIG. 1 is a perspective view showing a PC card according to a first embodiment of the present invention.

In the following, the embodiments according to the present invention will be described in detail. At first, the PC card according to the first embodiment, based on FIGS. 1 to 4, will be described.

Reference 1 denotes a PC card 1 capable of both 16-bit and 32-bit operation according to the present embodiment, and reference 2 denotes a casing 2 making an outward appearance of the PC card 1 and being formed by a thin plate. The casing comprises of a thin type frame with an upper and a lower part thereof, an upper panel 4 covering the upper side opening of the frame 3 in a lid, and having a swelled part 4A in a rectangular shape, and a lower panel 5 covering the lower side opening of the frame 3 in a lid, and having a swelled part 5A in the same rectangular shape. A board accommodation space 6 is formed in an interior thereof.

Figure 2:
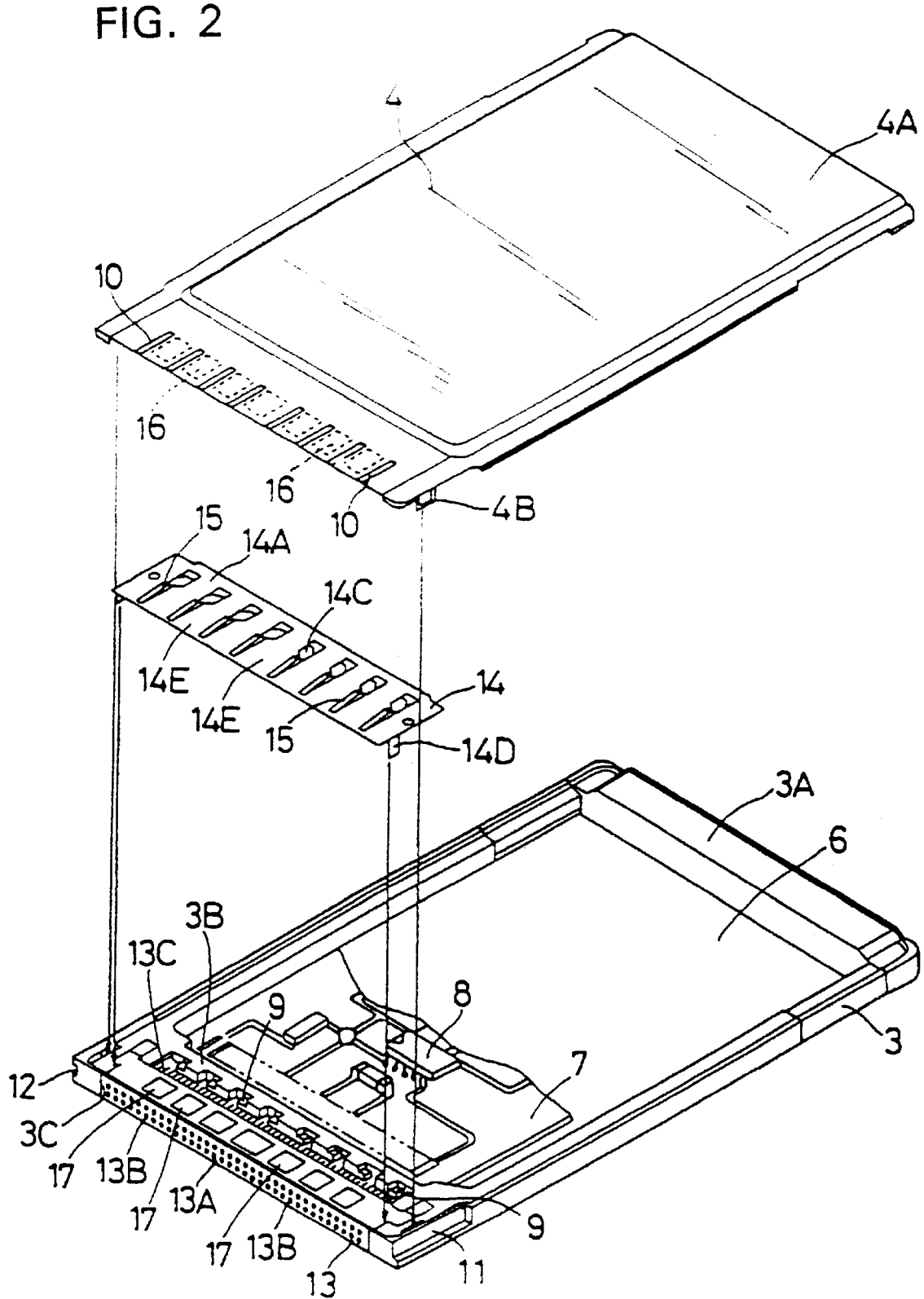
FIG. 2 is an exploded perspective view showing a frame, an upper panel, a connector on a card side, and a ground electrode that comprise the PC card according to the first embodiment of the present invention.

The frame 3, as shown in FIG. 2, includes a U shape frame 3A and a beam 3B for coupling a neighborhood of an opening edge of the frame 3A. From the beam 3B to a tip of the frame 3A, a connector receptacle 3C is disposed, and a connector 13 is engaged therewith. In the beam 3B, a plurality of receptacles 9 to be described below are formed. The frame 3A and the beam 3B may be integrally molded by molding and the like.

At the location abutted to the connector receptacle of the upper panel 4, a pair of arresting fingers are provided. On the upper surface of the connector receptacle 3C, a pair of holes for accommodating the arresting fingers are provided.

Reference 7 denotes a circuit board to be accommodated in the board accommodation space 6 of the casing 2.

Each receptacle 9 receives a tip of the spring-like projection 15 to be described below. Each receptacle 9 is formed in the beam 3B separated with a predetermined space. The number thereof is not of concern, but it may be eight, for example.

In the upper panel 4, there is provided a hole 10 for receiving the spring-like projection 15. When the upper panel 4, the ground electrode 14 and the frame 3A are placed together, the projection 15 projects from the upper surface of the panel 4 through the hole 10.

Reference 11 denotes a key groove formed on a left side of the insertion direction of the PC card 1, and the key groove 11 is located at the left side of the insertion direction on a side wall in a neighborhood of the connector receptacle 3C the frame 3, and is formed by cutting out the upper surface of the frame 3. The size of the key groove 11 is defined by a standard. In the PC, there is a key groove receiving part whose size is defined by a standard similarly, and is capable of receiving only a predetermined PC card.

Reference 12 denotes a guide groove formed at a right side of the insertion direction of the PC card 1, and the guide groove 12 is located at a right side of the insertion direction, in a neighborhood of the connector receptacle 3C of the frame 3, and is formed by making a groove processing on a side wall of the frame 3. The guide groove 12 has a size d0 that is also defined by a standard.

Reference 13 denotes a connector, and comprises, for example, a rectangular block 13A made of a resin, pin holes 13B in two rows and illustratively totalling 68, and a terminal pin 13C whose base end side is located at a deep part of the respective pin holes 13B, and whose tip side is connected to the circuit board 7 protruding from a rear surface of the rectangular block 13A.

Figure 3:
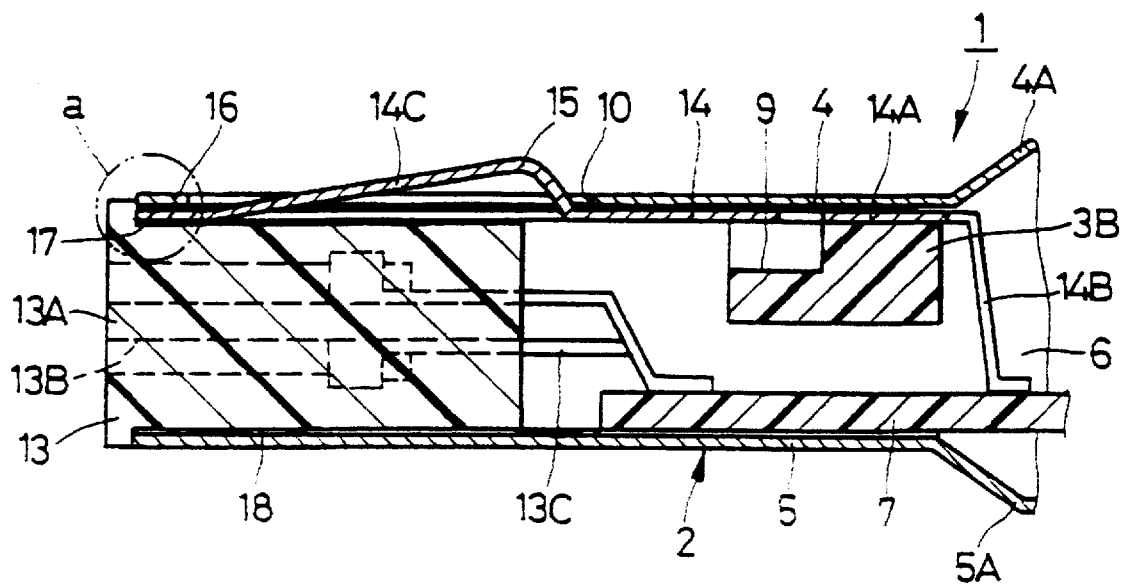
FIG. 3 is a vertical cross sectional view of the enlarged main parts as viewed from the insertion side of the PC card from the III—III direction indicated by an arrow in FIG. 1.

Reference 14 denotes a ground electrode mounted to the upper surface of the connector on the card side. The ground electrode 14 is, as shown in FIGS. 2, and 3, formed by a conductive metal plate. The ground electrode 14 covers most parts of the upper surface of the connector 13 on the card side. At the deep side in FIG. 2 of the ground electrode, a plurality (for example, 8) of ground terminals that extend toward the ground on the circuit board 7 side are provided. A tongue piece 14C is formed by cutting in the ground electrode while retaining one side opposite to the ground terminal 14B, i.e., the one side opposite to the circuit board 7, for example eight. A mid point of the tongue piece is bent in a mountain shape, and projects from the upper surface of the ground electrode 14. Also, a tip of the respective tongue pieces 14C, i.e., a tip of the spring-like projection 15 having a spring property turns to be a free end, and usually, it is biased to a lower part of the upper panel 4, and when the spring-like projection 15 is pressed from an upper side by an external force, the tip of the spring-like projection 15 is received into the receptacles 9 of the frame 3B. In the part where the ground electrode 14 abuts the connector receptacle 3C, a pair of arresting fingers 14D are provided. In the connector receptacle 3C the corresponding grooves are provided, and they receive the arresting fingers and fix the ground electrode 14.

Further, the gaps between the spring-like projections 15 adjacent each other among the flat plate part 14A of the ground electrode 14 are provided as flat surfaces 14E, 14E, ..., and a connector side adhesive film 17 to be described below is provided on the upper surface of the connector 13 opposite to the respective flat surfaces 14E. The adhesive film 17 is provided by screen printing the same adhesive as the adhesive film 16 on the upper panel side on the parts corresponding to the respective flat surfaces 14E of the ground electrode 14. Then, the respective connector side adhesive films 17 couple the flat plate 14A of the ground electrode 14 with the upper surface of the rectangular body 13A.

Similarly, in the part that is on the lower surface of the upper panel 4 and abuts to the ground electrode, the adhesive film 16 is provided. The adhesive film 16 is provided by screen printing the adhesive on the parts corresponding to the respective flat surfaces 14E of the ground electrode 14, i.e., on the parts except the projections 15. Further, since the respective adhesive 16 is formed by an adhesive (for example, a rubber type adhesive, an acrylic adhesive and the like) that is fused by heating, an interior of the upper panel 4 and the plate part 14A of the ground electrode 14 is coupled as enhancing an intimate contact by performing a heat-pressing with a hot press.

In FIG. 3, reference 18 denotes an adhesive film formed in the interior of the regions located at the connector 13 side of the lower panel 5, and is provided by screen printing the same adhesive as the adhesive 16. The adhesive film 18 couples the lower surface of the rectangular body 13A and the interior of the lower panel 5, and the lower surface of the rectangular body 13A and the circuit board 7.

In the following, a method of assembling a PC card will be described.

Figure 4:
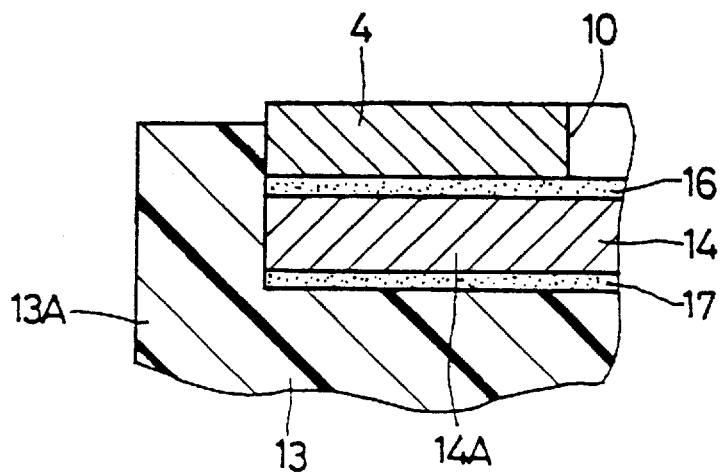
FIG. 4 is an enlarged cross sectional view showing the portion a in FIG. 3.

As shown in FIG. 2, in a state that the connector 13 is mounted to the connector receptacle 3C, the arresting fingers 14D of the ground electrode 14 are provided so as to sandwich both sides of the connector 13, and the respective ground terminals 14B of the ground electrode 14 is soldered to the circuit board 7 (see FIGS. 3 and 4). Thereafter, mating the respective projections 15 of the ground electrode 14 by inserting them through the respective holes 10 of the upper panel 4, thereby the upper panel 4 is mounted to the frame 3. On the other hand, the lower panel 5 is mounted to a lower side of the frame 3, as well (see FIGS. 3 and 4).

Then, the casings 2, the adhesive film 16, the adhesive film 17 and the adhesive film 18 are fused by heat-pressing a profile including the connector mounting receptacle 3C with the hot press. The adhesive film 16 fixes an interior of the upper panel 4 to an upper surface of the plate part 14A of the ground electrode 14, the adhesive film 17 fixes an upper surface of the connector 13 to a lower surface of the plate part 14A of the ground electrode 14, and the adhesive film 18 fixes an interior of the lower panel 5 to a lower surface of the connector 13.

Consequently, the adhesive film 17 on the connector side can securely fix the connector 13 on the card side and the plate part 14A of the ground electrode 14 enhancing intimate contact, and even when a torsional strength and the like are added to the connector mounting receptacle 3C at a time of attaching/detaching the PC card 1 to/from the card slot, it makes possible prevention of the ground electrode 14 from floating from the connector 13 on the card side. As a result, it makes possible to improve durability and to enhance reliability of the PC card 1.

Figure 5:
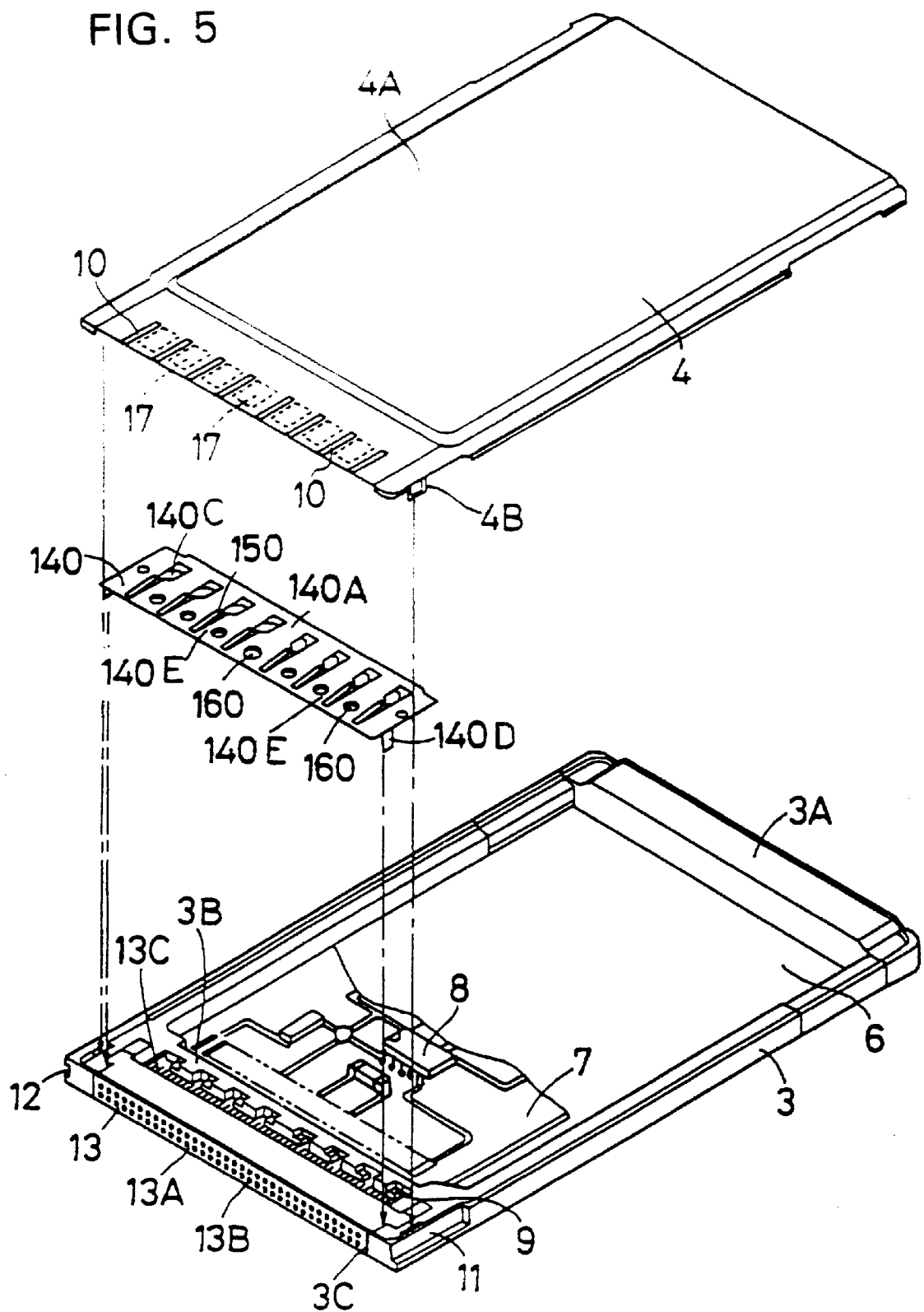
FIG. 5 is an exploded perspective view showing a frame, an upper panel, a connector on a card side, and a ground electrode that comprise the PC card according to another embodiment of the present invention.
Figure 6:
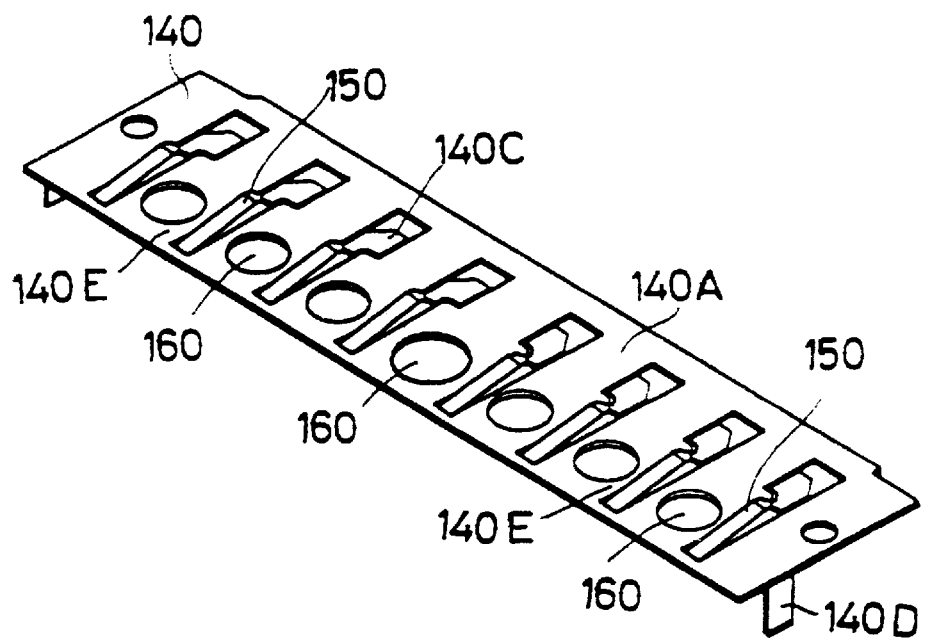
FIG. 6 is an enlarged perspective view showing the ground electrode in FIG. 5.
Figure 7:
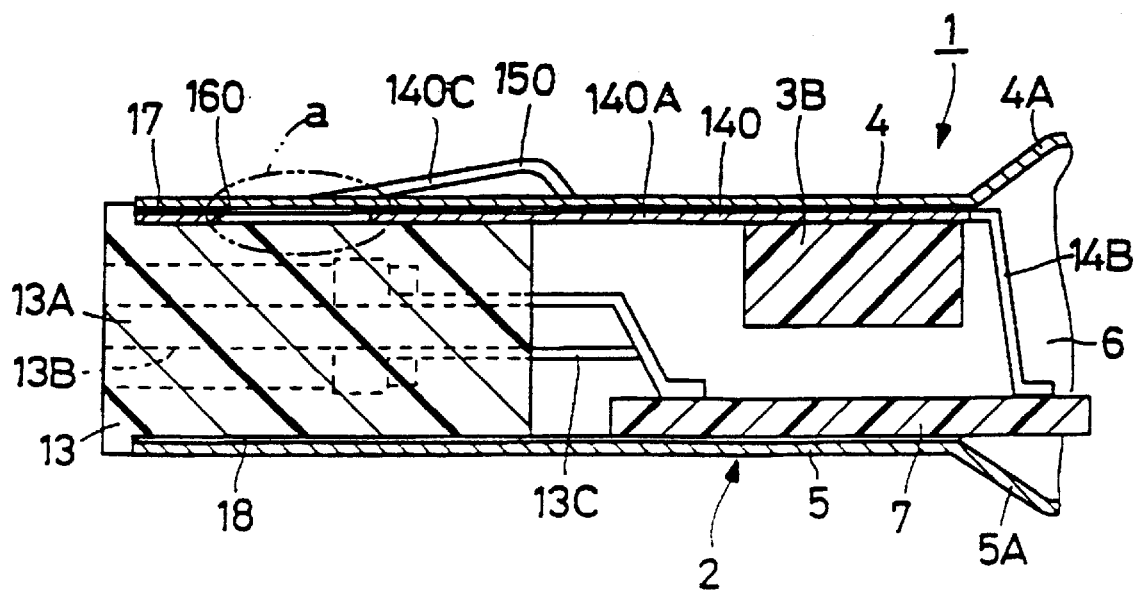
FIG. 7 is a vertical cross sectional view of the enlarged main parts of the PC card in FIG. 2.

Also, as shown in FIG. 5, holes 160 may be provided in the ground electrode 140. Other elements of the ground electrode 140 are the same as the ones shown in FIG. 2. FIG. 6 is an enlarged view of the ground electrode 140. The casings 2, the adhesive film 17, and the adhesive film 18 are fused by heat-pressing a profile including the connector receptacle 3C with the hot press. The adhesive film 17 thus fixes an interior of the upper panel 4 to an upper surface of the plate part 14A of the ground electrode 14, and the adhesive film 18 fixes an interior of the lower panel 5 to a lower surface of the rectangular body 13A.

Figure 8:
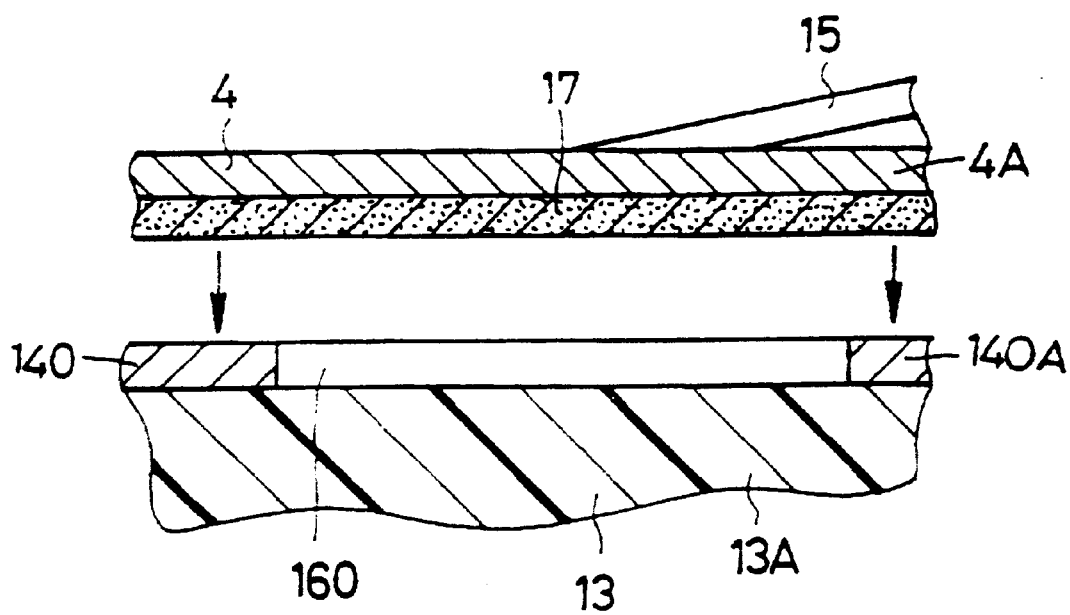
FIG. 8 is an enlarged cross sectional view showing the connector and the upper panel provided with the adhesive film in a state before fixing them.
Figure 9:
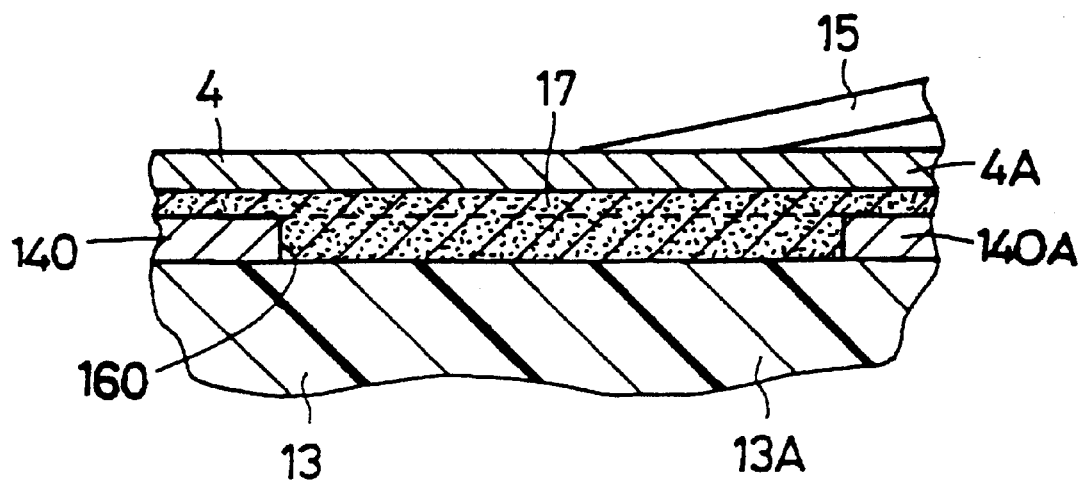
FIG. 9 is an enlarged cross sectional view showing the portion a in FIG. 7.
Figure 10:
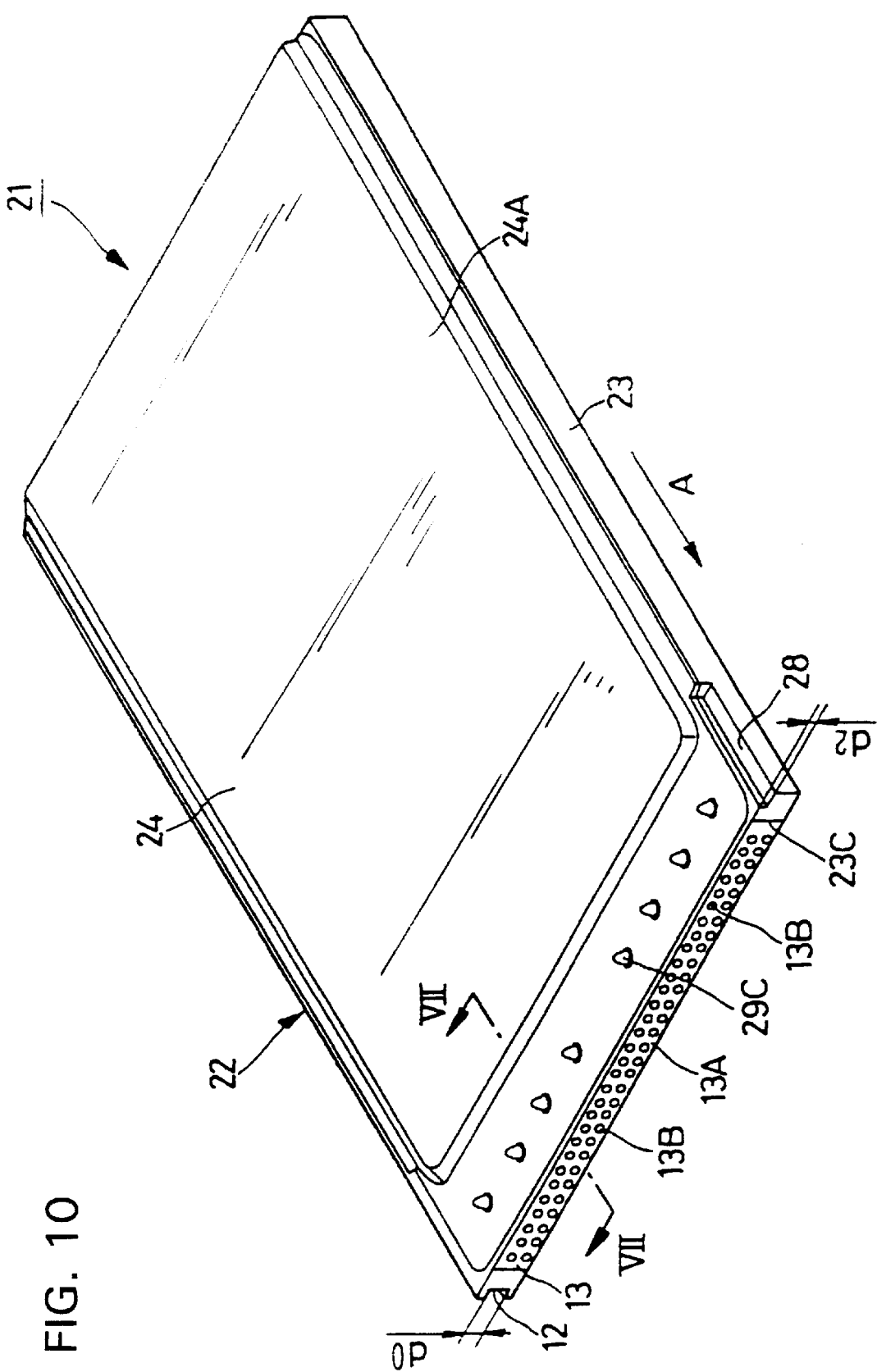
FIG. 10 is a perspective view showing the PC card according to the second embodiment of the present invention.

At this moment, the adhesive film 17 is, as shown in FIGS. 8 and 9, guided to an upper surface of the rectangular body 13A of the connector 13 on the card side through the respective guiding or adhesive conduction holes 160 by heat-pressing, and the adhesive film 17 can securely fix the connector 13 on the card side and the upper panel 4 enhancing intimate contact by sandwiching the ground electrode 14.

Further, the respective adhesive film 17 on the upper panel side and the adhesive film 18 on the lower panel side can be easily provided by a screen-printing. Also, since the adhesive film 17 is provided by screen-printing, an adjustment of the film thickness can be easily made, and since the adhesive film 17 on the upper panel side provided on the upper panel 4 is made slightly thickened in advance according to the present embodiment, it makes possible to guide the adhesive film 17 on the upper side into the respective conduction holes 160.

Further, the connector 13 on the side of the card corresponds to an insertion side of the PC card 1, and it is a place where a thickness restriction is very severe. Moreover, since the ground electrode 14 and the upper panel 4 are dual structured, in the upper side of the connector 13 on the card side, as adhering by heat-pressing according to the present embodiment, the adhesive film 16 on the upper panel side and the adhesive film 17 on the connector side are such that the adhesive thereof are smashed and spread, thereby enhancing an adhesive strength, and making the film thickness of the adhesive films 16, 17 much thinner, and as a result, enabling to make the thickness of the connector mounting receptacle 3C much thinner. Consequently, when attaching/detaching the PC card 1 to/from the card slot, it securely reduces the upper panel 4, the ground electrode 14 and the like to be hooked to the card slot side, thereby enhancing reliability of the PC card 1.

Moreover, since the respective adhesive films 17, 18 on the connector side provided on the rectangular body 13A of the connector 13 on the card side by a screen printing, among the upper surfaces of the rectangular body 13A, the respective adhesive film 17 on the connector side can be easily formed on the surfaces (sides) corresponding to the respective flat surfaces 14E of the ground electrode 14. As a result, for example, an adhesive film can be simply formed, comparing to form an adhesive film on the plate part 14A of the ground electrode 14.

Further, by forming a plurality of spring-like projections 15 in the ground electrode 14, the PC card 1 is made attachable to a card slot for 16-bit operation and a card slot for 32-bit operation, thereby it makes possible to be used for both 16-bit and 32-bit operation.

In the following, based on FIGS. 10 to 13, another embodiment according to the present invention will be described. A feature of the present embodiment is that in the ground electrode a plurality of projections are formed similar to the ones in the prior art. Further, in the present embodiment, the same symbols are attached to the same components as in the first embodiment described above, and the descriptions thereof are omitted.

Reference 21 denotes a PC card capable of 32-bit operation, reference 22 denotes a casing providing an external appearance of the PC card 21 and being formed in a thin plate shape. The casing 22 is, as almost similar to the casing 2 of the PC card 1, comprised of a frame 23, an upper panel 24 provided in an upper side opening of the frame 23, and having a swell part 24A in a rectangular shape, and a lower panel 25 provided in a lower side opening of the frame 23, and having a swell part 25A in a rectangular shape, and a board accommodation space 26 for accommodating a circuit board 7 is formed inside thereof.

Figure 11:
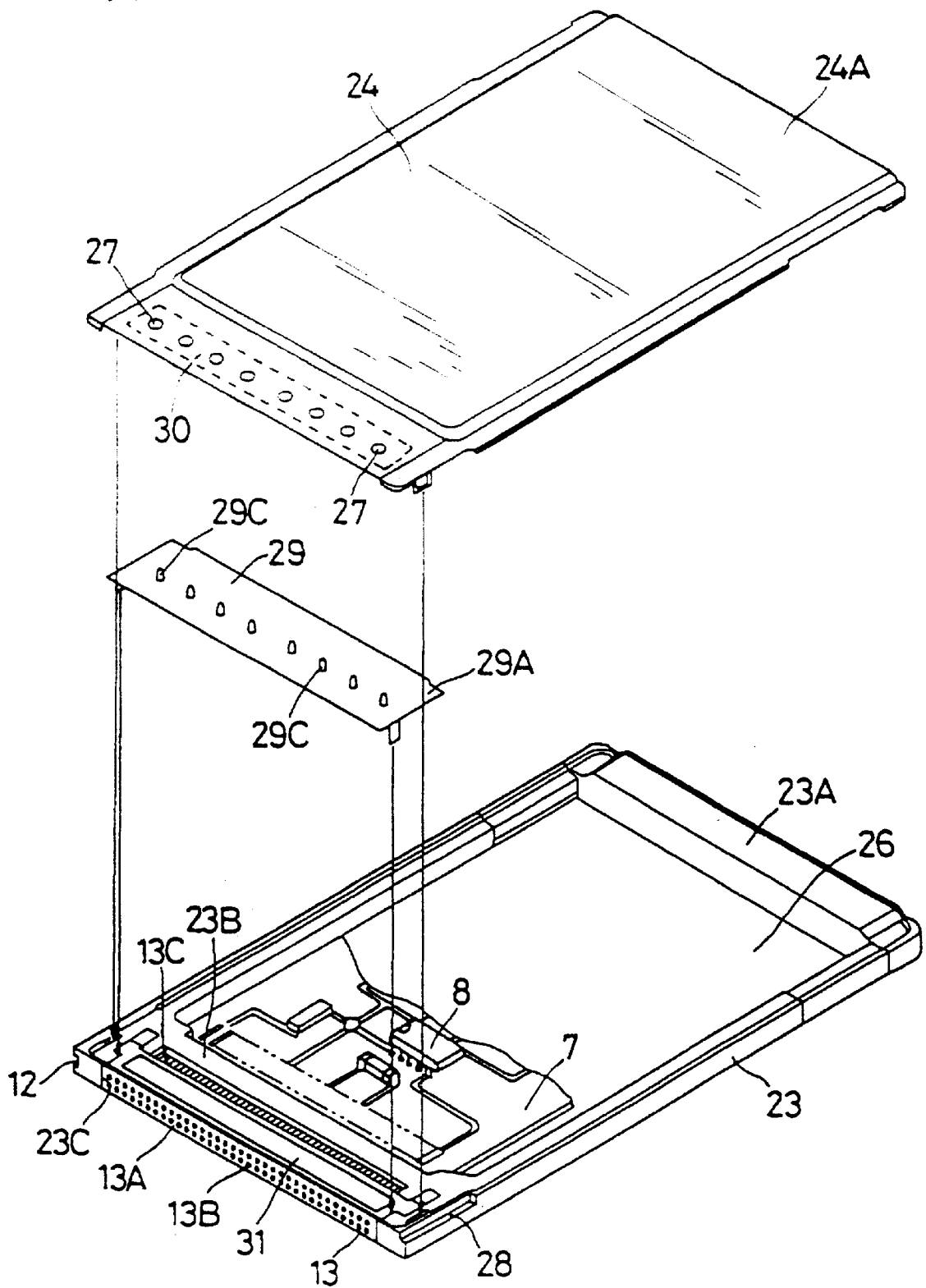
FIG. 11 is an exploded perspective view showing a frame, an upper panel, a connector on a card side, and a ground electrode that comprise the PC card according to the second embodiment of the present invention.

Herein, the frame 23 is, as shown in FIG. 11, comprised of a frame 23A in a U shape, a beam 23B for coupling a tip side of the frame 23A, and a connector mounting receptacle 23C formed at the tip of the frame 23A at the beam 23B. Further, an arrow A in FIG. 10 indicates an insertion direction of the PC card 21.

On the upper panel 24, in a region on the connector 13 side on the card side, a plurality of projection accommodation holes 27 of circular shape are provided, and the projections 29C of the ground electrode 29 to be described below project through the respective projection accommodation holes 27.

Further, a key groove 28 on the card side is formed at a left side in an insertion direction of the PC card 21, and the key groove 28 on the card side is formed in the groove width size d2 (d2<d1) that is the same as the key groove on the card side of the 32-bit PC card defined by a standard.

Figure 12:
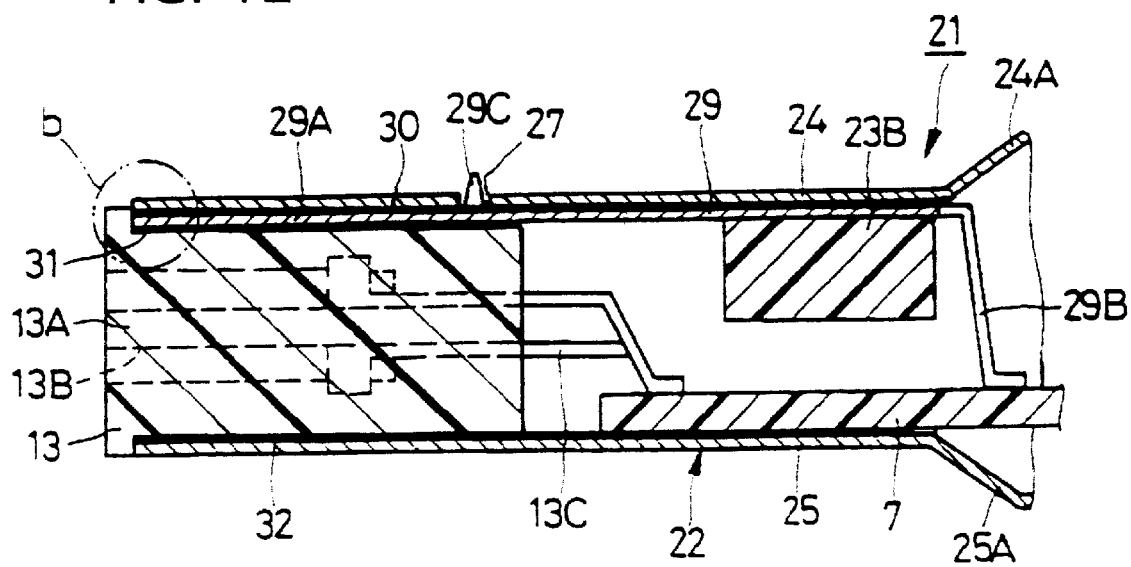
FIG. 12 is a vertical cross sectional view of the enlarged main parts as viewed from the insertion side of the PC card from the VII—VII direction indicated by an arrow in FIG. 10.
Figure 13:
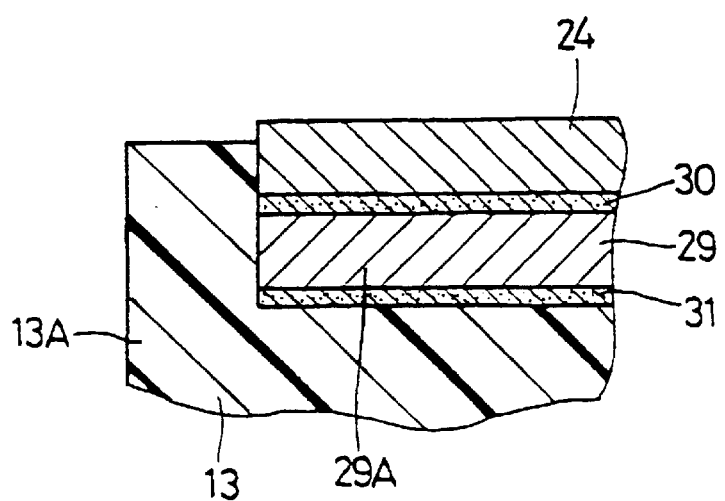
FIG. 13 is an enlarged cross sectional view showing the portion b in FIG. 12.

Reference 29 denotes a ground electrode mounted to an upper surface of the connector 13 on the card side, and the ground electrode 29 is, as shown in FIGS. 11, 12 and 13, comprised of a plate part 29A, a plurality of ground terminals 29B provided extendedly from the plate part 29A, and a plurality of (for example, 8) projections 29C formed in the plate part 29A. The respective projections 29C project upwardly through the respective projection accommodation holes 27 of the upper panel 24.

Reference 30 denotes an adhesive film on an upper panel side formed at an interior of a region located at the connector 13 side on the card side of the upper panel 24. Reference 31 denotes an adhesive film on the connector side formed on the upper surface of the rectangular body 13A, and 32 denotes an adhesive film on the lower panel side formed at an interior of a region located at the connector 13 side on the card side of the lower panel 25.

Then, as similar to the first embodiment, by implementing heat pressure with a hot press, the adhesive film 30 on the upper panel side fixes the interior of the upper panel 24 to the upper surface of the plate part 29A of the ground electrode 29, and the adhesive film 31 on the connector side fixes the upper surface of the rectangular body 13A of the connector 13 on the card side to the lower surface of the plate part 29A of the ground electrode 29, and the adhesive film 32 on the lower panel side fixes the interior of the lower panel 25 to the lower surface of the rectangular body 13A.

In the PC card 21 configured as described above, the operation and advantages similar to the ones of the first embodiment described above can be obtained, the connector 13 on the card side and the ground electrode 29 can be fixed to enhance an intimate contact by the adhesive film 31 on the connector side, and hence preventing the ground electrode 29 from floating, thereby enabling enhancing durability and reliability of the PC card 21.

Figure 14:
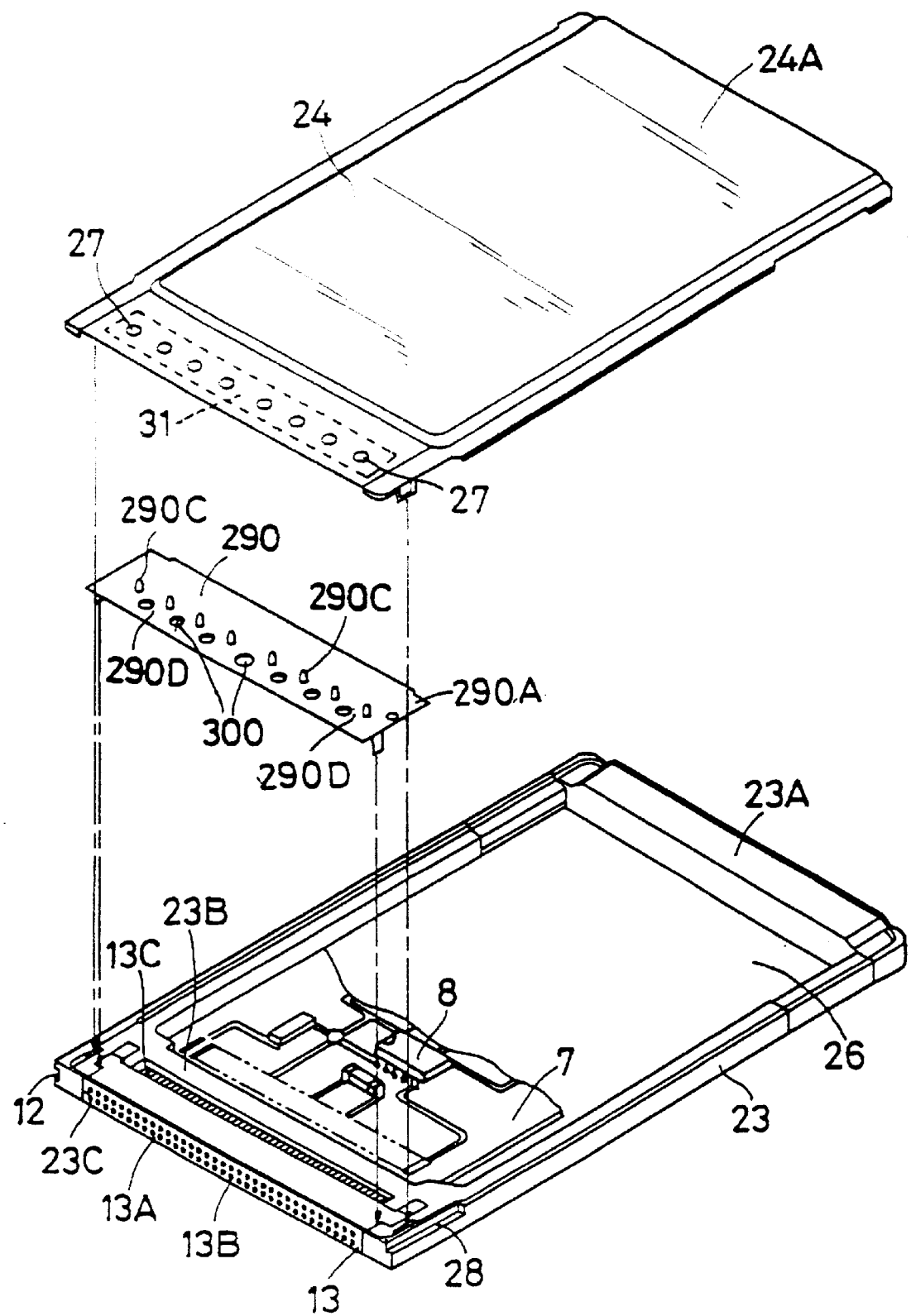
FIG. 14 is an exploded perspective view showing a frame, an upper panel, a connector on a card side, and a ground electrode that comprise the PC card according to the second embodiment of the present invention.
Figure 15:
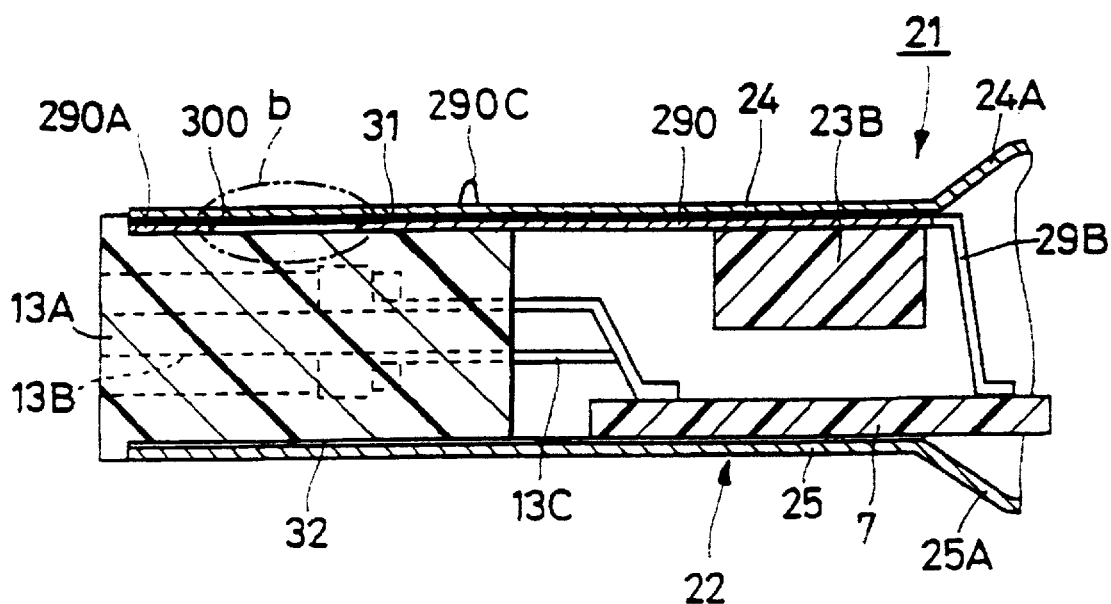
FIG. 15 is a vertical cross sectional view of the enlarged main parts as viewed from the insertion side of the PC card.
Figure 16:
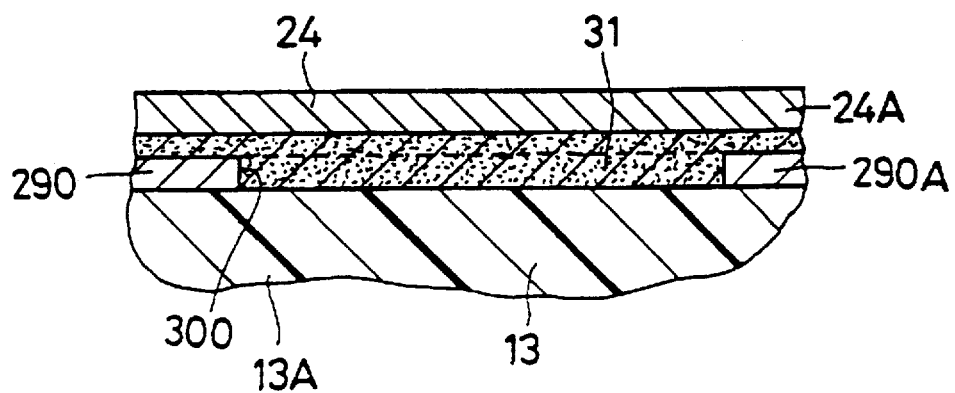
FIG. 16 is an enlarged cross sectional view showing the portion b in FIG. 15.

Further, conduction holes may be provided in the ground electrode 290 (see FIG. 14). Reference 300 denotes a conduction hole as a conduction path, the respective conduction holes 300 being formed as positioning on the respective flat surfaces 290D of the plate part 290A of the ground electrode 290. The respective conduction holes 300 are the ones that guide an adhesive of the adhesive film 31 on the upper panel side to be described below onto an upper surface of the connector 13 on the card side.

Reference 31 denotes an adhesive film on the upper panel side formed on an upper surface of the rectangular body 13A, and reference 32 denotes an adhesive film on the lower panel side formed on an inner surface of the region located on the connector side 12 on the card side of the lower panel 25.

Then, by implementing a heat press with a hot press, the adhesive film 31 fixes the inner surface of the upper panel 24 to the upper surface of the plate part 290A of the ground electrode 290, and the adhesive film 32 fixes the inner surface of the lower panel 25 to the lower surface of the connector 13.

At this moment, the adhesive of the adhesive film 31 is guided to an upper surface of the connector 13 on the card side through the respective conduction holes 300 by the heat press, and the adhesive film 31 on the upper panel side can securely couple the connector 13 on the card side with the upper panel 24 by sandwiching the ground electrode 290 and enhancing an intimate contact.

Figure 17:
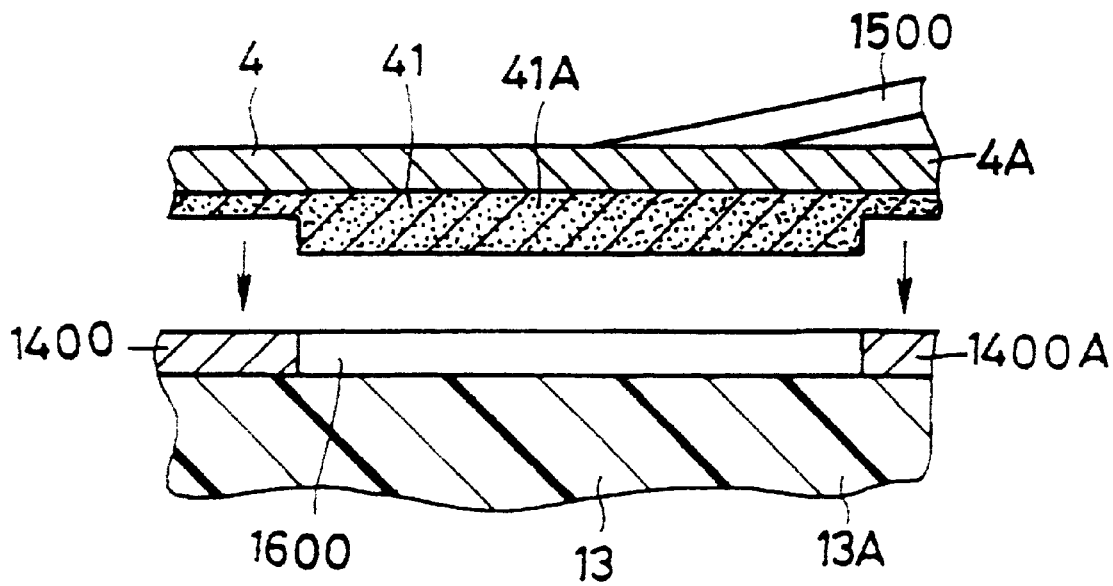
FIG. 17 is an enlarged cross sectional view showing the PC card according to another embodiment, with the connector and the upper panel provided with the adhesive film in a state before fixing them.

In the following, based on FIGS. 17 and 18, a third embodiment according to the present invention will be described. A feature of the present embodiment is that the projection part 41A having a shape corresponding to the conduction hole 16 is formed on the adhesive film 41 by an adhesive. Further, in the present embodiment, the same symbols are labeled on the same elements as in the first embodiment described above, and the descriptions thereof are omitted.

Figure 18:
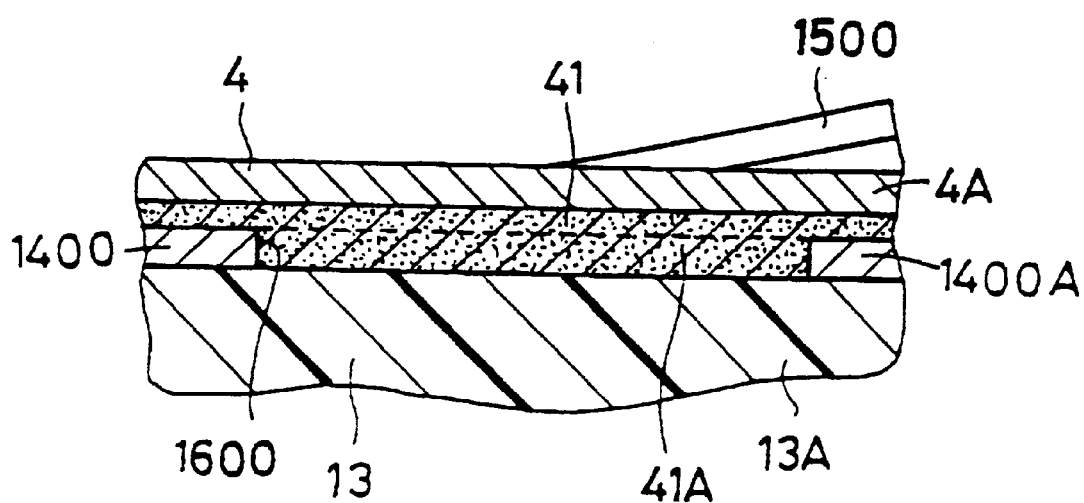
FIG. 18 is an enlarged cross sectional view showing the upper panel, the ground electrode, and the connector in the state of being fixed.

Consequently, in the present embodiment, since the projection part 41A of a thick film with an adhesive is formed on the adhesive film 41 on the upper panel side, as shown in FIG. 18, implementing a heat pressure with a hot press, upon providing the upper panel 4 to the connector 13 on the card side with which the ground electrode 1400 is mounted, a tip of the projection part 41A reaches to an upper surface of the rectangular body 13A of the connector 13 through the conduction hole 16, thereby enabling firmly fixing the upper panel 4 and the connector 13 by sandwiching the ground electrode 1400.

Figure 19:
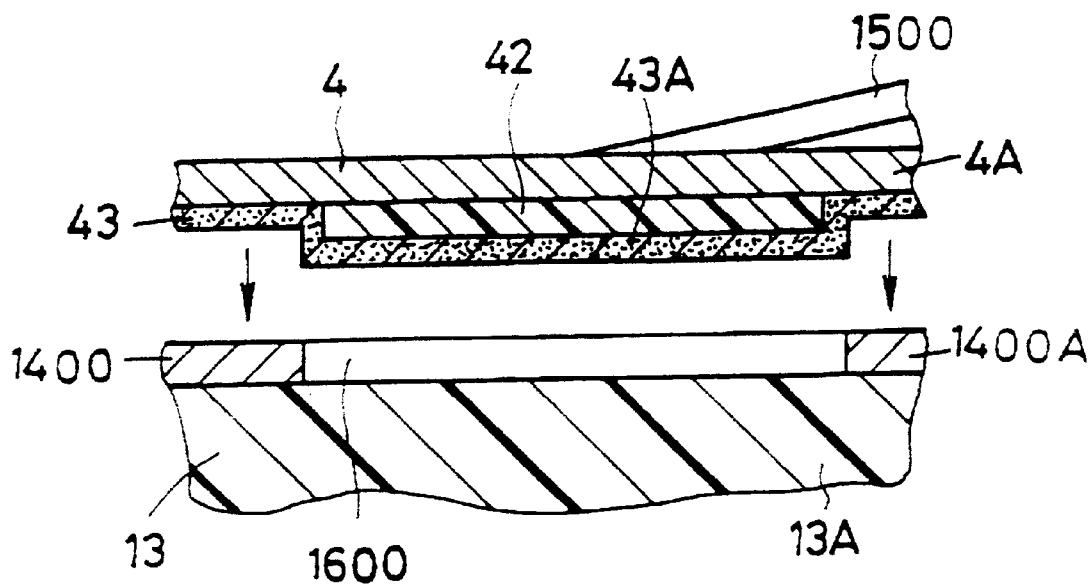
FIG. 19 is an enlarged cross sectional view showing the PC card according to an alternate embodiment, with the connector and the upper panel provided with the adhesive film in a state before fixing.
Figure 20:
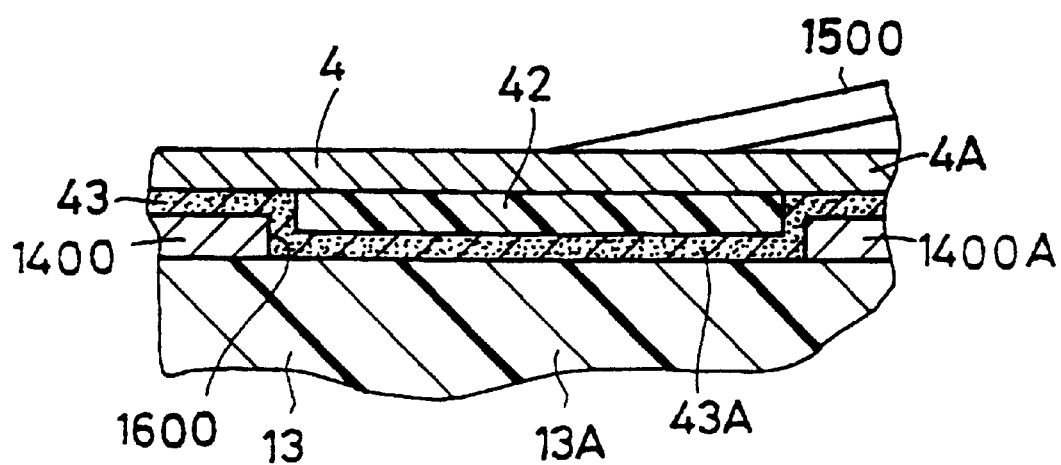
FIG. 20 is an enlarged cross sectional view showing the upper panel, the ground electrode, and the connector in the state of being fixed.

Further, as a means for forming a projection part on an adhesive film, such as the alternate embodiments shown in FIGS. 19 and 20, by forming a convex body 42 on the lower surface of the upper panel 4 with a resist, and then by printing an adhesive thereon, an adhesive film 43 having a projection part 43A may be formed.

Figure 21:
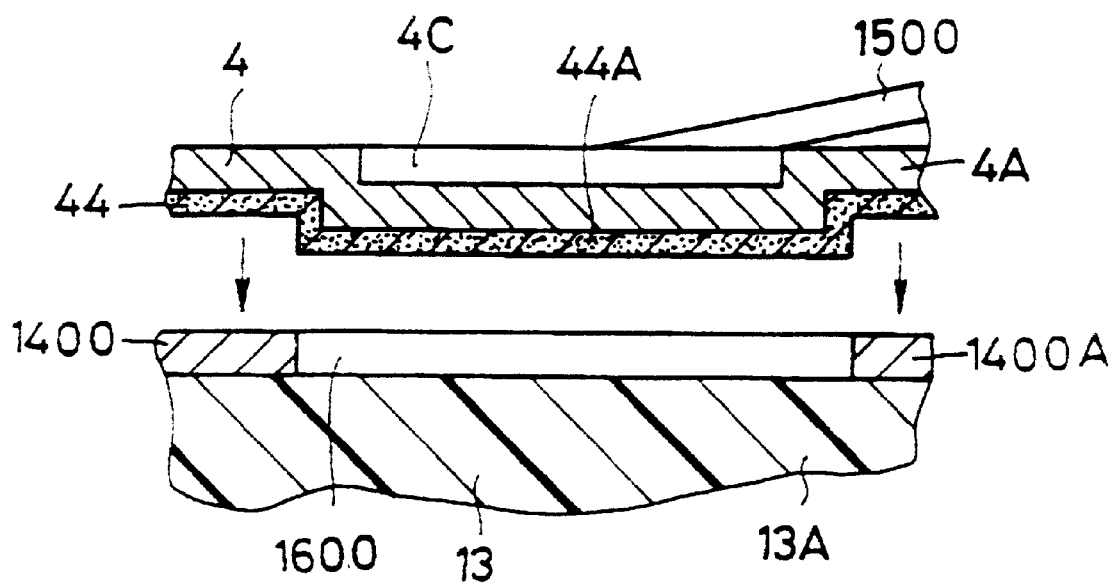
FIG. 21 is an enlarged cross sectional view showing the PC card according to another alternate embodiment, with the connector on the card side and the upper panel provided with the adhesive film in a state before fixing them.
Figure 22:
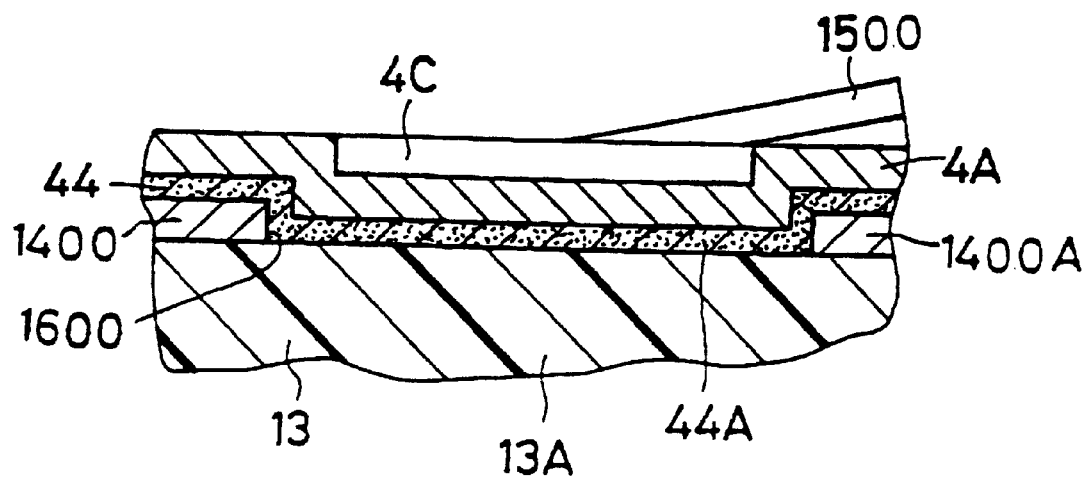
FIG. 22 is an enlarged cross sectional view showing the upper panel, the ground electrode, and the connector in the state of being fixed.

Moreover, in a second embodiment shown in FIGS. 21 and 22, by forming, in advance, a concave part 4C that projects on the lower surface side of the upper panel 4, and then by printing an adhesive thereon, an adhesive film 44 having a projection part 44A that projects with an amount of the concave part 4C may be formed.

Figure 23:
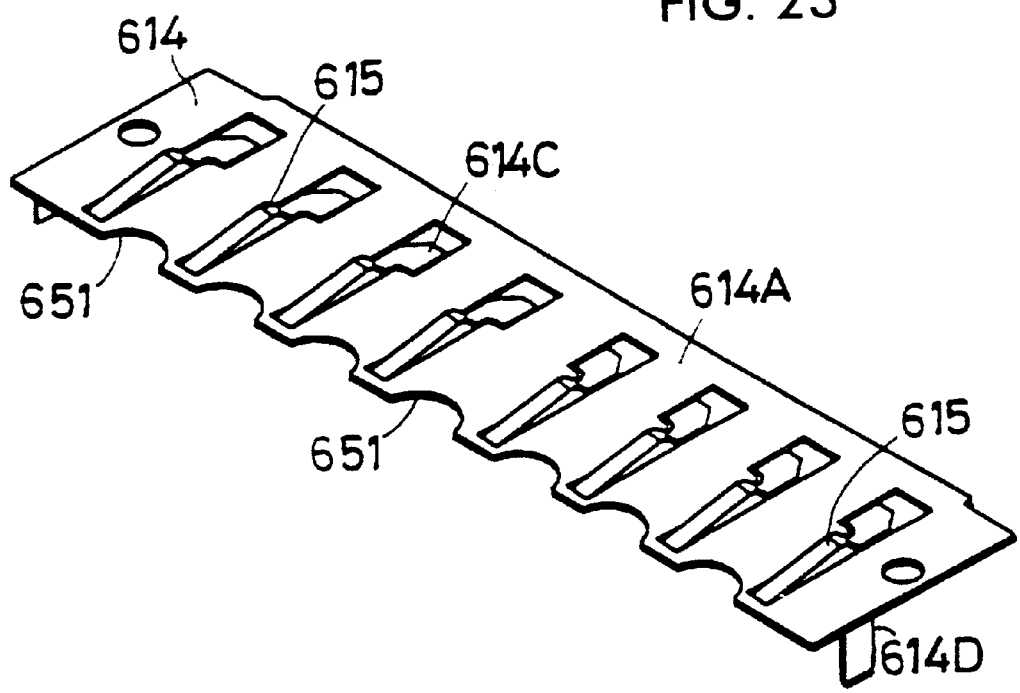
FIG. 23 is a perspective view of the ground electrode according to yet another alternate embodiment.

On the other hand, FIG. 23 shows another embodiment corresponding to the first embodiment, and in this embodiment, the conduction path formed in the end part of the plate part 614A of the ground electrode 614 is formed as a notch 651 in an arc shape. By forming the conduction path with the notch 651 as described above, it makes possible to obtain the action and advantages similar to the ones in the above described embodiments, and further, since the respective notches 651 are located on the insertion side of the PC card, a strength of this part can be enhanced.

Figure 24:
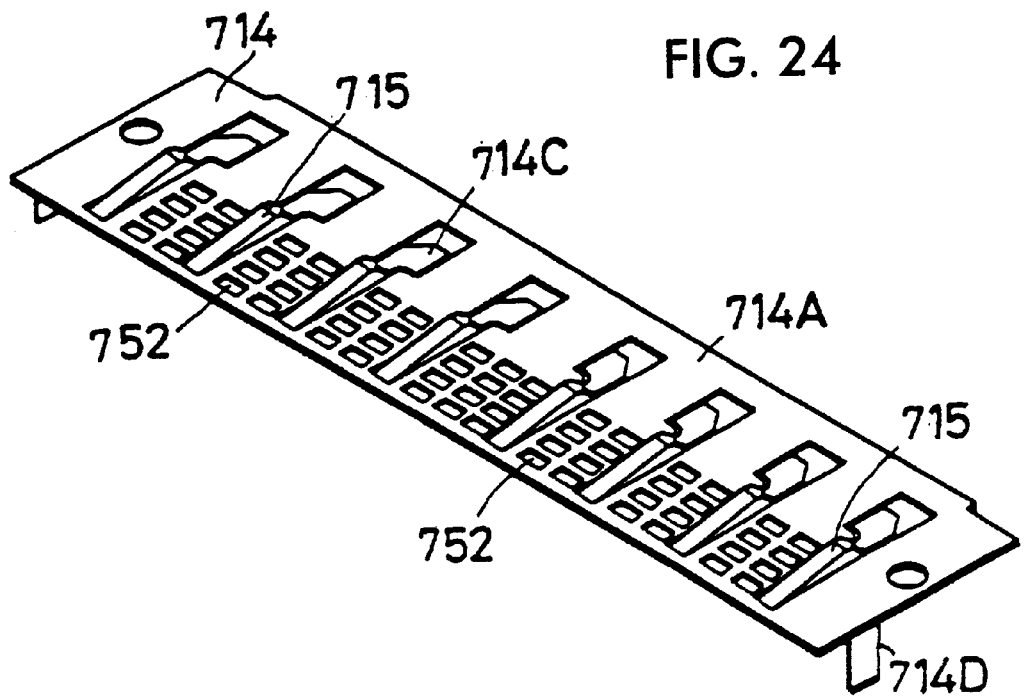
FIG. 24 is a perspective view of the ground electrode according to yet another alternate embodiment.

Moreover, FIG. 24 shows yet another alternate embodiment, wherein a plurality of small holes 752 are provided in line at the regions located between the respective spring-like projections 715 of the plate part 714A of the ground electrode 714. By forming the conduction path by respective small holes 752 as described above, it makes possible to obtain the action and advantages similar to the ones in the above described first embodiment, and further, with the respective small holes 752, the area on which the adhesive is guided to the connector side on the card side can be secured with a great amount, and thus the ground electrode, the upper panel and the connector on the card side can firmly fixed.

Figure 25:
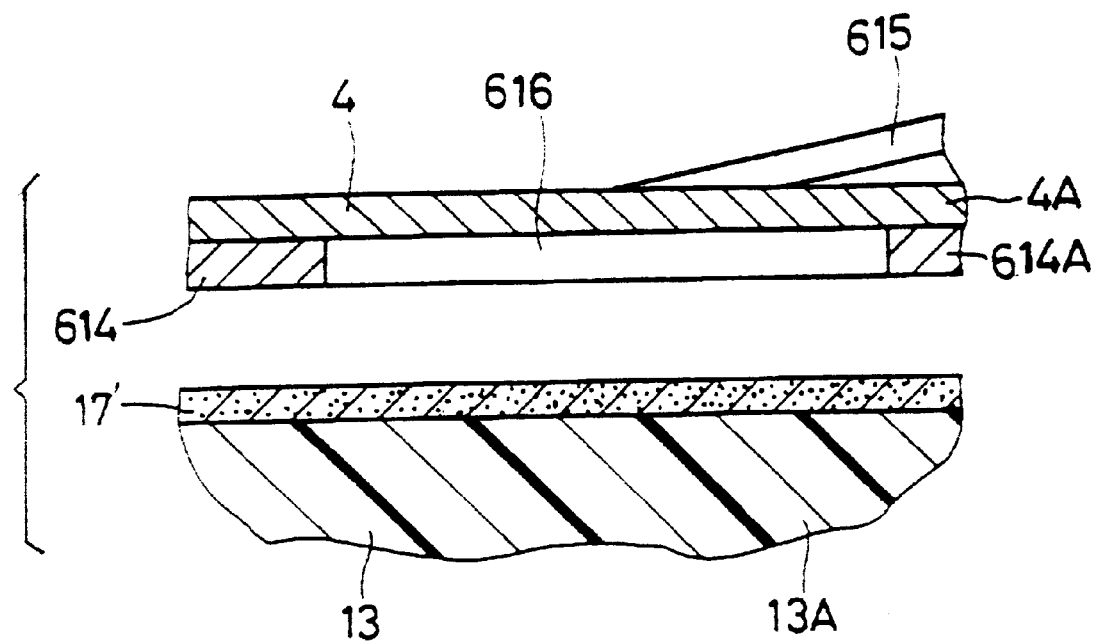
FIG. 25 is an enlarged cross sectional view showing the PC card according to yet another alternate embodiment, with the upper panel and the connector on the card side provided with the adhesive film in a state before fixing them.
Figure 26:
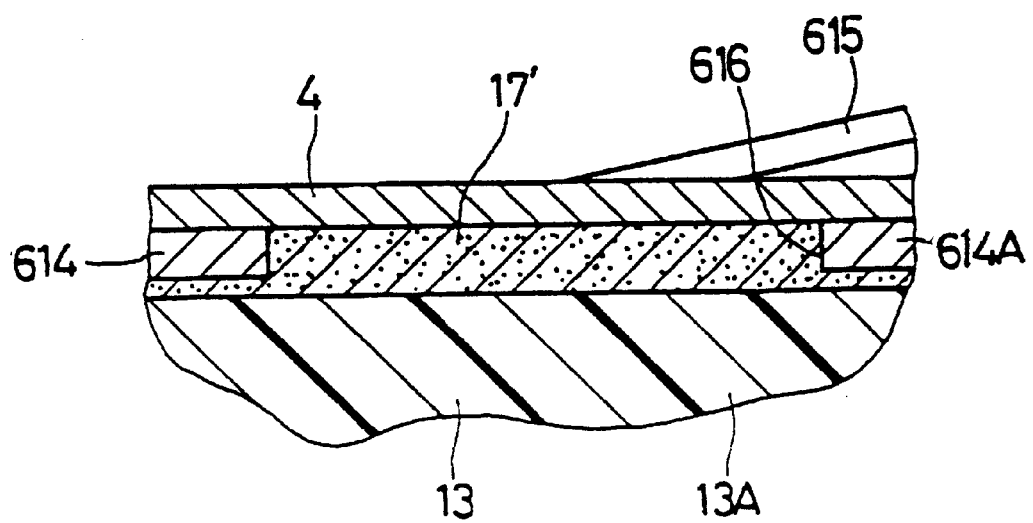
FIG. 26 is an enlarged cross sectional view showing the upper panel, the ground electrode, and the connector in the state of being fixed.

Further, in these embodiments, there is described the case where the adhesive is formed as an adhesive film 17 (31, 41, 43, 44) on the lower surface of the upper panel 4 (24), but the present invention is not limited to this. In the alternate embodiments shown in FIGS. 25 and 26, the adhesive film 17' may be formed on the upper surface of the connector 13.

In this case, the adhesive film 17' can couple, including the ground electrode 14, the upper panel 4 with the connector 13 in a state enhancing intimate contact, and can prevent the ground electrode 614 from floating away from the connector 13 on the card side, thereby enabling enhancing durability and reliability of the PC card.

Further, the above mentioned third and fourth embodiments describe a case wherein the ground electrode 14 has a spring-like projection 615 that is used in the first embodiment, but it is apparent that the present invention is not limited to this case.

Figure 27:
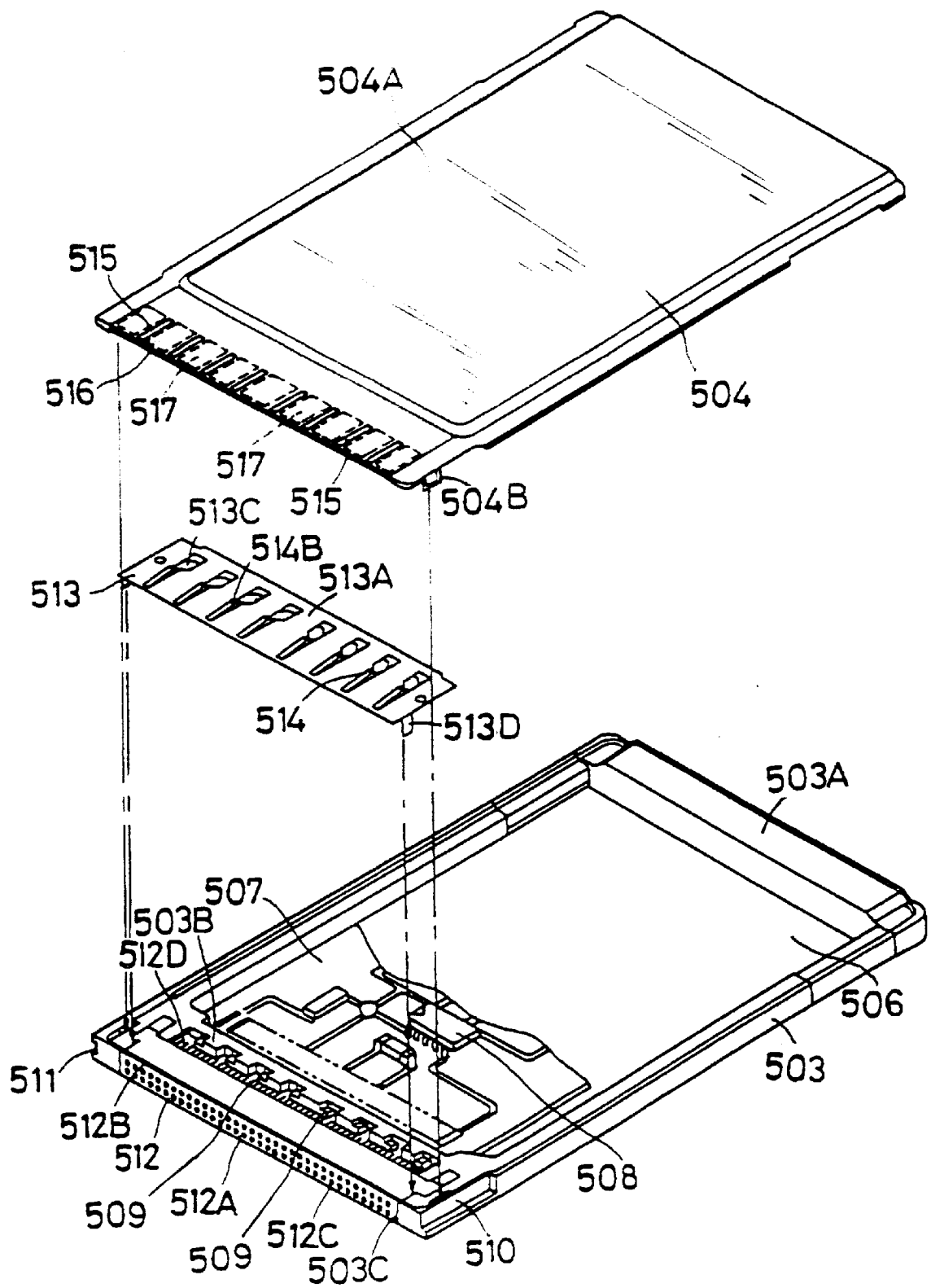
FIG. 27 is an exploded perspective view showing a frame, an upper panel, a connector on a card side, and a ground electrode that comprise the PC card according to another embodiment of the present invention.
Figure 28:
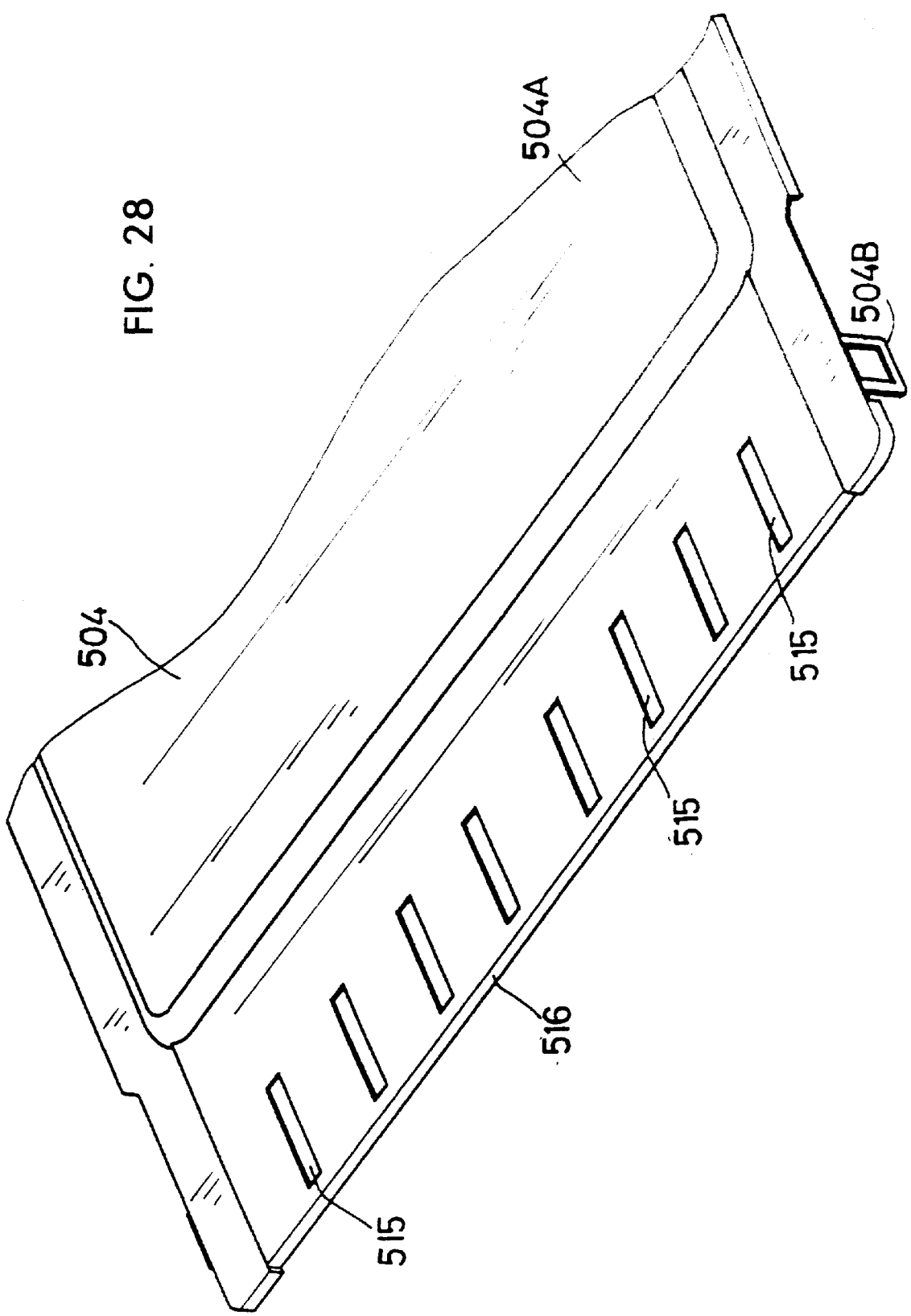
FIG. 28 is an enlarged perspective view showing a tip side of the upper panel.

In the following the PC card according to another embodiment will be described. In FIG. 27, reference 515 denotes a plurality of projection accommodation holes provided in regions located on the connector receptacle 303C side of the upper panel 504, and the respective projection accommodation holes 515 are formed in a rectangular shape, and the respective projection accommodation holes 515 are provided to project the spring-like projection 514 to the outside by inserting through the spring-like projections 14 of the ground electrode 513.

Figure 29:
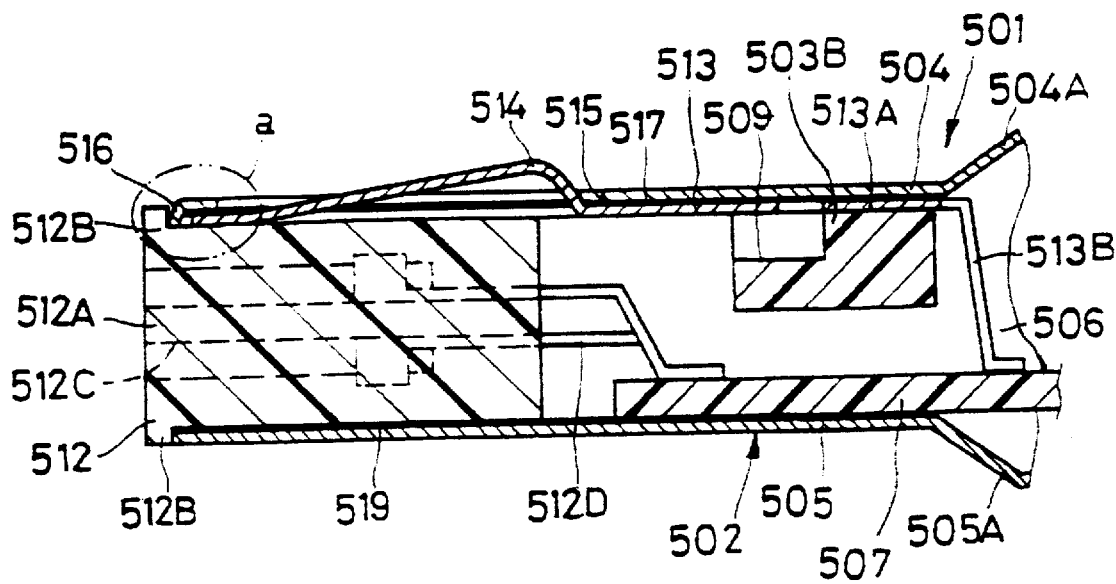
FIG. 29 is a vertical cross sectional view of the PC card in FIG. 27.
Figure 30:
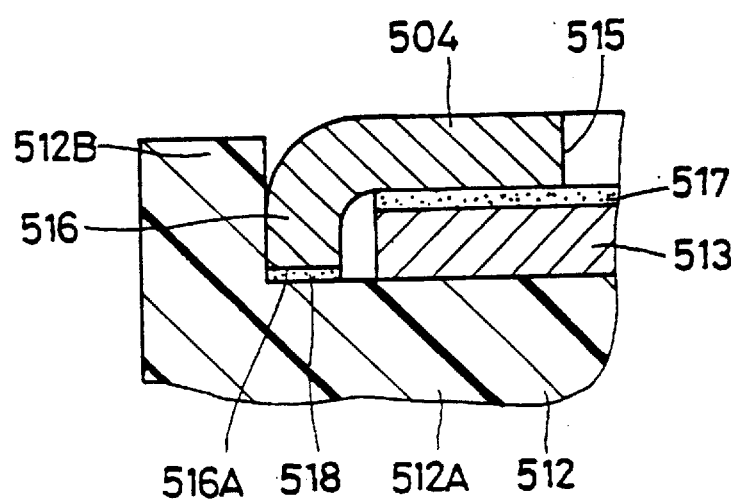
FIG. 30 is a cross sectional view of the enlarged main parts showing the portion a in FIG. 29.

Reference 516 (FIG. 29) denotes an L shaped bent part that is provided at a tip of the upper panel 504 and is bent in an L shape toward the connector 512 on the card side, and the L shape bend part 516 is, as shown in FIGS. 29 and 30, formed across almost a full width in a width direction of the upper panel 504. Further, a tip of the L shape bend part 516 is located by the engagement projection 512B of the connector 512, and the upper panel 504 stops a disconnection in the insertion direction A, as well as protects the L shape bend part 516 by preventing the L shape bend part 516 from directly colliding with the card slot side, when inserting the PC card 1 into the card slot and the like. Further, an end surface 516A of the L shape bend part 516 is abutted to the rectangular body 512A of the connector 512 on the card side via an adhesive film 518 to be described below (see FIG. 30).

Reference 517 denotes an adhesive film with a configuration similar to the adhesive film shown in FIG. 2. Reference 518 denotes an adhesive film on a tip side formed on the surface opposite to the connector 512 on the card side of the L shape bend part 516, and the adhesive film 518 on the tip side is formed by screen printing the same adhesive as the adhesive film 517, on the end surface 516A of the L shape bend part 516. The adhesive film 518 adheres the end surface 516A of the L shape bend part 516 and the rectangular body 512A of the connector 512.

Reference 519 denotes an adhesive film that is equivalent to the one shown in FIG. 3.

An assembly of the PC card 501 is as follows. As shown in FIG. 29, in a state whereby the connector 512 is mounted to the connector receptacle 503C, the respective mounting pieces 513D (FIG. 27) of the ground electrode 513 are imposed by sandwiching from both sides of the connector 512 on the card side, and then the respective ground terminals 513B of the ground electrode 513 are soldered to the circuit board 507 (see FIG. 29). Thereafter, the respective spring-like projections 514 of the ground electrode 513 are inserted through the respective projection accommodation holes 515 of the upper panel 504, and the upper panel 504 is mounted to the frame 503. A lower panel 505 is also mounted on the lower side of the frame 503 (see FIGS. 29 and 30).

By heat pressing a profile including the connector receptacle 503C with a hot press, the adhesive film 517, the adhesive film 518, and the adhesive film 519 are fused. The adhesive film 517 thus fixes an inside surface of the upper panel 504 to a lower surface of the connector 512. At this moment, the adhesive film 518 formed on the end surface 516A of the L shape bend part 516 fixes the end surface 516A to the connector 512.

The PC card 501 formed as described above, with the L shape bend part 516 that is located at the tip of the upper panel 504 and that is provided in a width direction enhances the planeness of the tip, and enhances the strength against bending, thereby suppressing a deformation of the tip. Thus, it can prevent the upper panel 504 from floating away from the connector 512. As a result, the ground electrode 513 sandwiched between the upper panel 504 and the connector 512 is firmly fixed to the connector 512, thereby enabling to control the ground electrode 513 from floating away from the connector 512 on the card side.

In addition, since the tip of the L shape bend part 516 is located by the engagement projection 512B of the connector 512, the upper panel 504 prevents a stop of a disconnection in the insertion direction A, as well as protects the L shape bend part 516 by preventing the L shape bend part 516 from directly colliding with the card slot side, when inserting the PC card 1 into the card slot and the like. Further, since the end surface 516A is adhered to the rectangular body 512A, with an adhesive film 518 formed at an end surface 516A of the L shape bend part 516, the ground electrode 513 is more firmly fixed to the connector 512 on the card side.

As a result, even when a torsional force or the like is provided to the connector receptacle 503C at a time of attaching/detaching the PC card 501 to/from the card slot, it can securely prevent the ground electrode 513 from floating away from the connector 512 on the card side, thereby enabling enhancement or durability and reliability of the PC card 501.

Further, if by a time-elapsed degradation or the like of the adhesive film 518, the tip of the upper panel 504 should float, since the L shape bend part 516 is located in the engagement projection 512B of the connector 512, and further the end surface 516A is bent toward the rectangular body 512A, the end surface 516A of the L shape bend part 516 will not be exposed from the engagement projection 512B of the connector 512. This protects the end surface 516A, and further extends the life time of the PC card 501.

Figure 31:
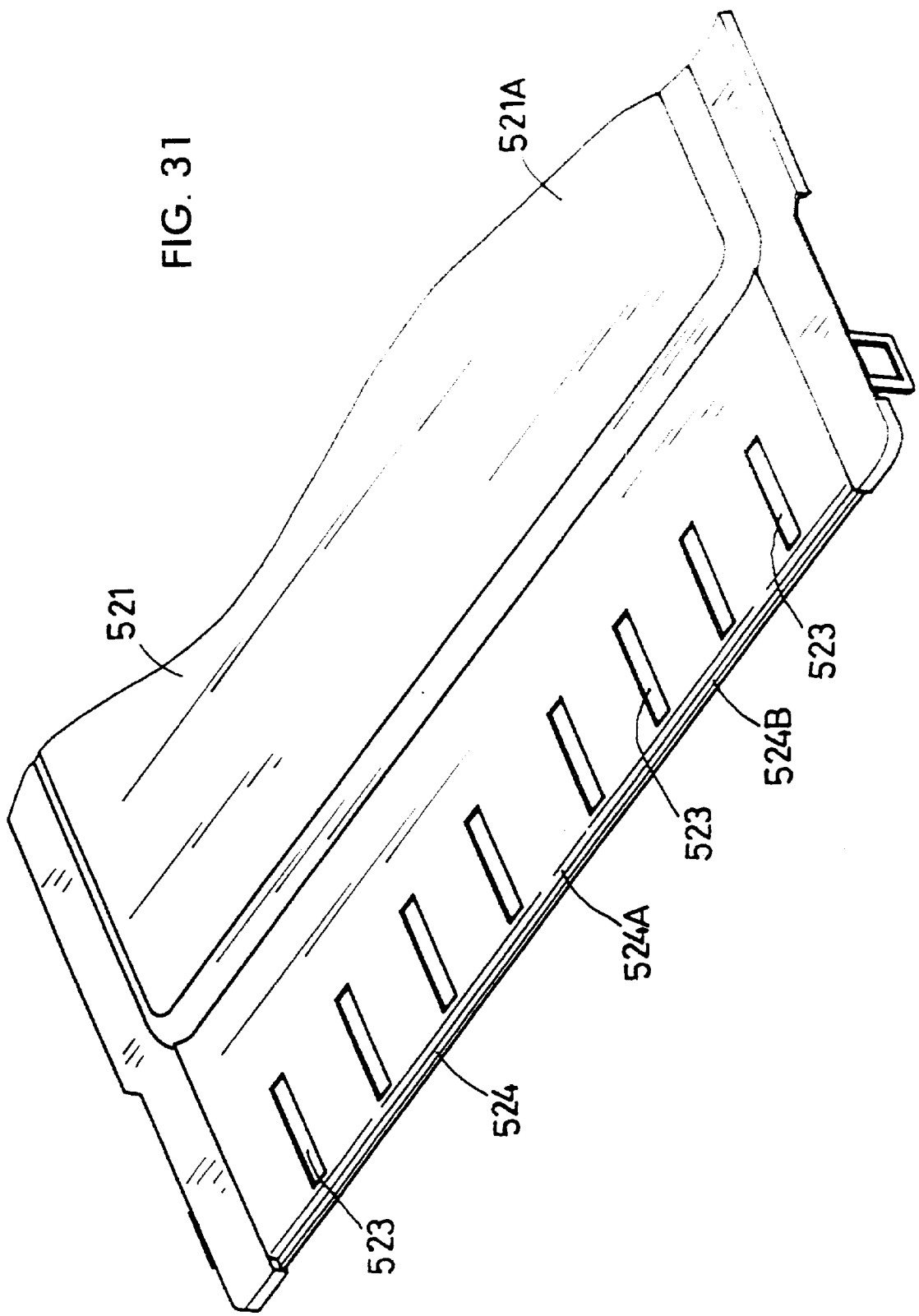
FIG. 31 is an enlarged perspective view showing a tip side of the upper panel according to another embodiment.
Figure 32:
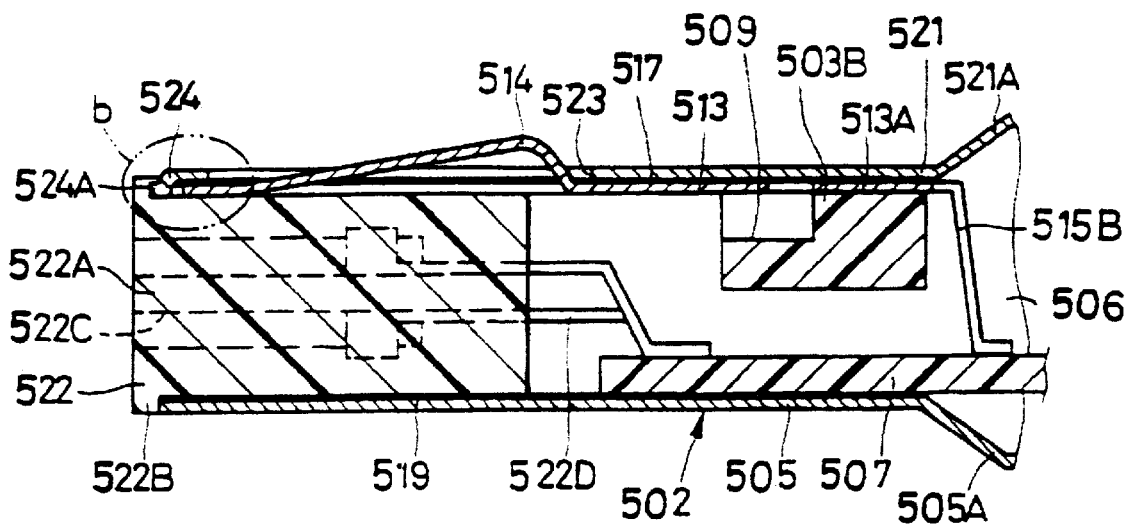
FIG. 32 is a vertical cross sectional view, as viewed from the same position as in FIG. 29, that shows the insertion side of the PC card according to the second embodiment; as viewed from the insertion side of the PC card from the VII—VII direction indicated by an arrow in FIG. 10.
Figure 33:
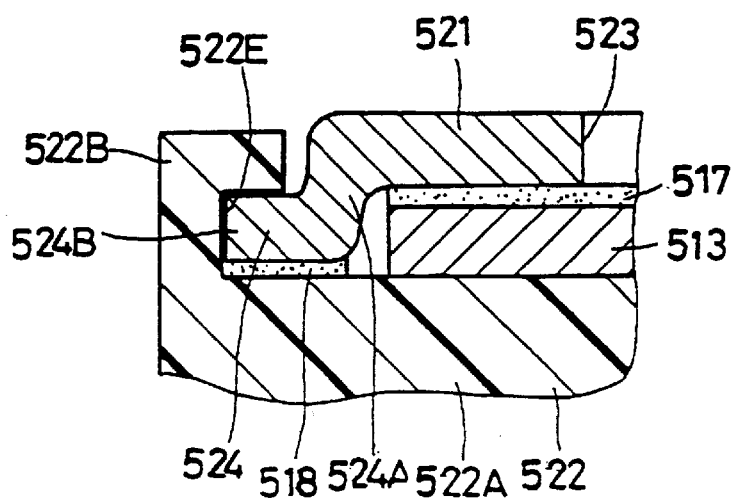
FIG. 33 is a cross sectional view of the enlarged main parts showing the portion b in FIG. 32.

In the following, based on FIGS. 31~33, another embodiment will be described. The feature of the present embodiment is that a bend is formed as a stepped bend by bending it in a stepped shape toward the connector, and a U shaped support for sandwiching the stepped bend is provided at a tip of the connector.

Reference 521 denotes an upper panel to be used in the present embodiment, and the upper panel 521 is formed to have a rectangular bulge 521A, similar to the upper panel 504 described in the above mentioned embodiment.

Reference 522 denotes a connector that is used in place of the connector 512 on the card side, and the connector 522 is, similar to the connector 512, comprised of a rectangular body 522A, engagement projections 522B, and a plurality of terminal pins 522D. However, in the present embodiment, it is different in regard to the point that a U shape sandwiching part 522E having a cross section of an approximately U shape for sandwiching the flat part 524B of the stepped bend part 524 to be described below is formed on the engagement projection 522B located at the tip of the upper surface of the rectangular body 522A.

Reference 523 denotes a plurality of projection accommodation holes provided on the tip side of the upper panels 21. The respective projection accommodation holes 523 allow the spring-like projections 514 to project to the outside, by inserting the spring-like projections 514 of the ground electrode 513 therethrough.

Reference 524 denotes a stepped bend that is provided on a tip of the upper panel 521 and is bent in a stepped shape toward the connector 522 on the card side, and the stepped bend 524 is formed across almost a full width in a width direction of the upper panel 521. The stepped bend 524 comprises a step 524A that is bent perpendicularly to the plate thickness direction, and a flat part 524B that is bent again at a right angle from the step 524A.

Further, the flat part 524B of the stepped bend 524 is sandwiched with the U shape support 522E of the connector 522, and is provided to prevent floating of the upper panel 521, as well as to protect the stepped bend 524 by preventing the stepped bend 524 from directly colliding with the card slot side, when the PC card is inserted into the card slot. Further, the flat part 524B of the stepped bend 524 is adhered to the connector 522 on the card side by an adhesive film 518 (see FIG. 33).

The PC card formed as describe above enhances the planeness of the tip as well as enhances bending strength by the stepped bend 524 provided at the tip of the upper panel 521, thereby suppressing a deformation of the tip. Further, by sandwiching the flat part 524B formed at the tip of the stepped bend 524 with the U-shaped support 522E of the connector 522 on the card side, it makes possible preventing the tip of the upper panel 521 from floating away from the connector 522 on the card side. Moreover, as shown in FIG. 33, the flat part 524B is adhered to the connector 522 by the adhesive film 518, thereby enabling fixing the upper panel 521 to the connector 522 more firmly.

As a result, the ground electrode 513 that is sandwiched between the upper panel 521 and the connector 522 is fixed to the connector 522 on the card side, enabling to control the ground electrode 513 from floating from the connector 522 on the card side.

Moreover, in the present embodiment, since the flat part 524B of the stepped bend 524 is sandwiched so as to be covered with the U shape support 522E of the connector 522 on the card side, it protects the stepped bend 524 by preventing the stepped bend 524 from directly colliding with the card slot side, when the PC card is inserted into the card slot or the like, thereby enabling further extending the life time thereof.

Figure 34:
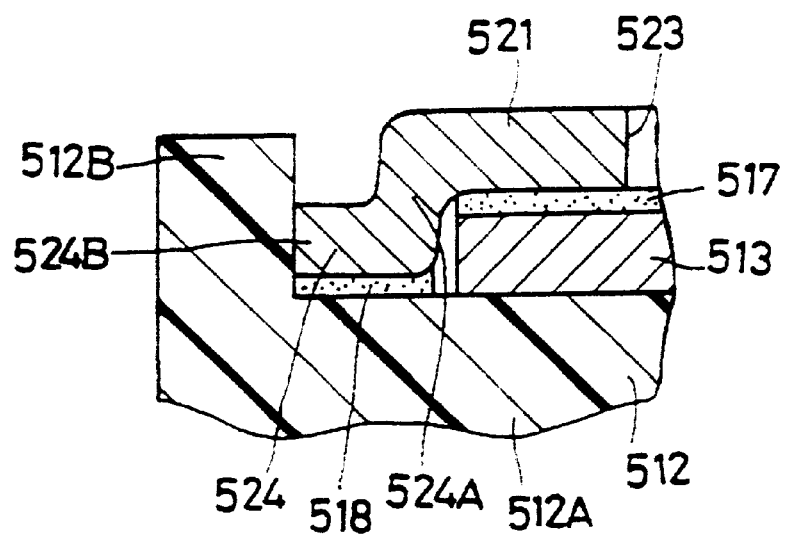
FIG. 34 is a cross sectional view of the enlarged main parts showing an alternate embodiment.

Further, herein, it is described that the flat part 524B of the stepped bend 524 is sandwiched with the U shape support 522E, but the present invention is not limited to this, and as shown in FIG. 34, it may be fixed to the connector 512, and in this case, by adhering the flat part 524B to the connector 512 with the adhesive film 518, the upper panel 521 can be firmly fixed to the connector 512.

Also, the shape of the stepped bend 524 is formed in a crank shape with the step 524A that is bent perpendicularly in the plate thickness direction, and the flat part 524B that is bent again at a right angle from the step 524A, but the present invention is not limited to this. As an alternate embodiment shown in FIG. 35, the step 524A' of the stepped bend 524' may be inclined toward the flat part 524B'.

Figure 35:
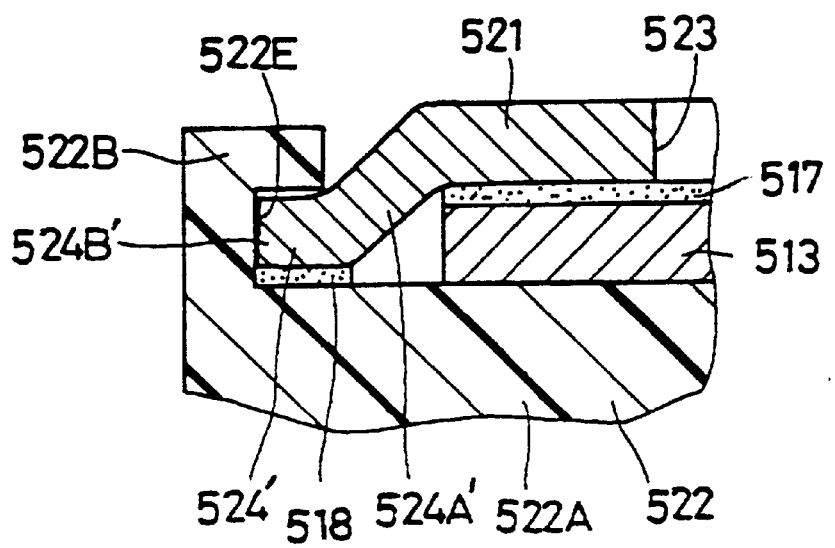
FIG. 35 is a cross sectional view of the enlarged main parts showing another alternate embodiment.

Further, as an alternate embodiment in FIG. 35, it is not necessary to provide the adhesive film 518 to the L shape bend 516. In this case, the planeness of the tip of the upper panel 504 is enhanced by the L shape bend 516 that is located at the tip of the upper panel 504 and is formed as extending approximately toward in the width direction, and can enhance bending strength, thereby preventing the ground electrode 513 from floating away from the connector 512.

Figure 36:
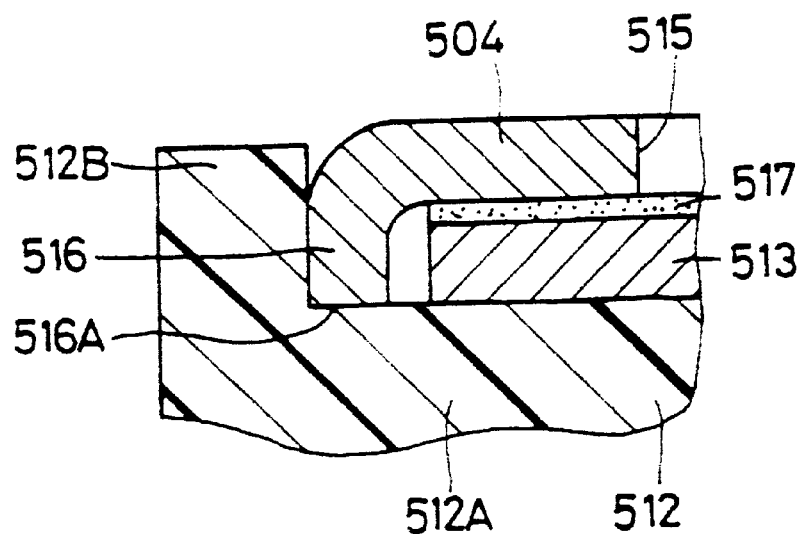
FIG. 36 is a cross sectional view of the enlarged main parts showing another alternate embodiment.
Figure 37:
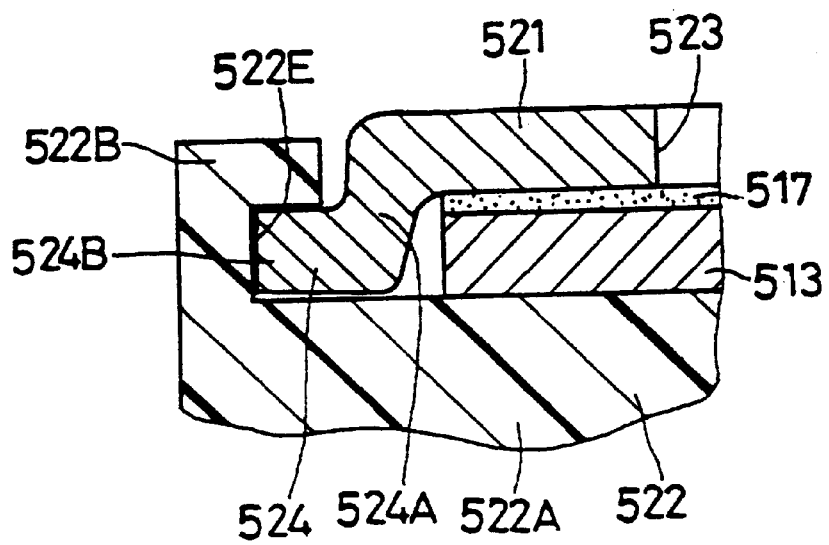
FIG. 37 is a cross sectional view of the enlarged main parts showing yet another alternate embodiment.

Furthermore, as shown in FIG. 36, the adhesive film 518 of FIG. 35 that is formed on the stepped bend 524 may be eliminated. Even in this case, the planeness of the upper panel 521 is enhanced by the stepped bend 524, thereby enabling enhanced bending strength. Thereby, floating of the ground electrode 513 from the connector 522 can be prevented.

Although all PC cards described above are capable of being attached to the 32-bit card slot by a key groove, it may be arranged that they can not be attached to a 16-bit card slot, and prevent the respective projections of the ground electrode from damaging the card slot side, thereby enabling them to be used only for 32-bit card slots.

Further, the adhesive film may be formed in the plate part of the ground electrode.

Moreover, in the embodiments, there are described the standardized ones for 32-bit and 16-bit PC cards, but the invention is not limited to the standards according to the embodiments shown. For example, the invention may be used for PC cards for 64-bit, 128-bit standards, etc., and the like.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An information processing apparatus, comprising:

a frame body, one end thereof being a connector mounting receptacle, the frame body accommodating a circuit board at an inside portion thereof;

two panels covering both sides of said frame body as lids, respectively;

a connector provided at the connector mounting receptacle of said frame body for connecting said circuit board to a personal computer;

a ground electrode provided sandwiched between one of said two panels and said connector, for connecting a ground of said circuit board to a ground of said personal computer, wherein an adhesive film is provided between said connector and said ground electrode; and further wherein an adhesive film is provided at a location opposite to said connector on said one panel, and a guiding path in said ground electrode is provided that guides said adhesive film provided on said one panel to said connector; and wherein said ground electrode comprises:

a plate part extending along a length direction of said connector; and a plurality of spring-like projections formed by making notches in said plate part, the spring-like projections supplying a spring-property when inserting the apparatus into a card slot of the personal computer, wherein said guiding path is provided on a flat surface between the spring-like projections adjacent each other on said plate part.

2. An information processing apparatus, comprising:

a frame body, one end thereof being a connector mounting receptacle, the frame body accommodating a circuit board at an inside portion thereof;

two panels covering both sides of said frame body as lids, respectively;

a connector provided at the connector mounting receptacle of said frame body for connecting said circuit board to a personal computer; and a ground electrode provided sandwiched between one of said two panels and said connector, for connecting a ground of said circuit board to a ground of said personal computer, wherein an adhesive film is provided at a location opposite to said one panel on said connector, and a guiding path in said ground electrode is provided that guides said adhesive film provided on said connector to said one panel; further wherein said ground electrode comprises:

a plate part extending along a length direction of said connector; and a plurality of spring-like projections formed by making notches in said plate part, the spring-like projections supplying a spring-property when inserting the apparatus into a card slot of the personal computer.

3. An information processing apparatus, comprising:

a frame body, one end thereof being a connector mounting receptacle, the frame body accommodating a circuit board at an inside portion thereof;

two panels covering both sides of said frame body as lids, respectively;

a connector provided at the connector mounting receptacle of said frame body for connecting said circuit board to a personal computer;

a ground electrode provided sandwiched between one of said two panels and said connector, for connecting a ground of said circuit board to a ground of said personal computer, wherein an adhesive film is provided between said connector and said ground electrode; and wherein said ground electrode comprises:

a plate part extending along a length direction of said connector; and a plurality of spring-like projections formed by making notches in said plate part, the spring-like projections supplying a spring-property when inserting the apparatus into a card slot of the personal computer, wherein said adhesive film is provided between a flat surface between the spring-like projections adjacent each other on said plate part and said connector.

4. The information processing apparatus of claim 3, wherein said adhesive film is provided on said connector in advance and has a configuration such that said ground electrode is coupled to said adhesive film.

5. The information processing apparatus of claim 3, wherein an adhesive film is provided at a location opposite to said connector on said one panel, and a guiding path in said ground electrode is provided that guides said adhesive film provided on said one panel to said connector.

6. The information processing apparatus of claim 5, wherein said ground electrode comprises:

a plate part extending along a length direction of said connector; and a plurality of projections formed on said plate part, wherein said guiding path is provided on a flat surface between the projections adjacent each other on said plate part.

7. The information processing apparatus of claim 5, wherein in the adhesive film provided on said one panel, a projection part is included at a location corresponding to a guiding path of said ground electrode.

8. An information processing apparatus, comprising:

a frame body, one end thereof being a connector mounting receptacle, the frame body accommodating a circuit board at an inside portion thereof;

two panels covering both sides of said frame body as lids, respectively;

a connector provided at the connector mounting receptacle of said frame body for connecting said circuit board to a personal computer; and a ground electrode provided sandwiched between one of said two panels and said connector for connecting a ground of said circuit board to a ground of said personal computer, wherein a bend part that is bent toward said connector is provided at a tip of said one panel so that said ground electrode is fixed to the connector; further wherein said ground electrode comprises:

a plate part extending along a length of said connector; and a plurality of spring-like projections formed by making notches in said plate part, the spring-like projections supplying a spring-property when inserting the apparatus into a card slot of the personal computer.

9. The information processing apparatus claim 8, wherein said bend part is formed as an L shaped bend part, by bending a tip of said one panel toward said connector in a L shape.

10. The information processing apparatus of claim 8, wherein said bend part is formed as a stepped bend part, by bending a tip of said one panel toward said connector in a stepped shape.

11. The information processing apparatus of claim 8, wherein said bend part is formed as a stepped bend part, by bending a tip of said one panel toward said connector in a stepped shape, and a U shaped sandwiching part for sandwiching said stepped bend part is provided at the tip of said connector.

12. The information processing apparatus of claim 8, wherein, in said bend part, an adhesive film is provided at a surface opposite to said connector.

13. The information processing apparatus of claim 8, wherein said bend part is formed across almost a full width in a width direction of said one panel.

\* \* \* \* \*